(12) United States Patent
Ebizuka et al.

(10) Patent No.: US 6,509,742 B1
(45) Date of Patent: Jan. 21, 2003

(54) ELECTROMAGNETIC NOISE MEASUREMENT APPARATUS, ELECTROMAGNETIC NOISE MEASUREMENT METHOD AND RECORDING MEDIUM

(75) Inventors: Yasuo Ebizuka, Ebina (JP); Masayuki Hirata, Ebina (JP); Kazunori Yamada, Tokyo (JP); Haruo Shinozaki, Yokohama (JP); Toru Matsuzaki, Yokohama (JP); Takaji Morita, Tokyo (JP)

(73) Assignee: Fuji Xerox Co., Ltd., Tokyo (JP)

( * ) Notice: Subject to any disclaimer, the term of this patent is extended or adjusted under 35 U.S.C. 154(b) by 55 days.

(21) Appl. No.: 09/718,335

(22) Filed: Nov. 24, 2000

(30) Foreign Application Priority Data

Apr. 18, 2000 (JP) ........................................ 2000-117107

(51) Int. Cl.⁷ ............................................. G01R 27/28
(52) U.S. Cl. ...................... 324/627; 324/628; 324/613; 455/67.3
(58) Field of Search ................................ 324/693, 76.14, 324/76.12, 76.19, 76.27, 76.41, 76.51, 102, 612–614, 627, 628; 327/113, 119, 291; 331/78; 455/226.1, 226.2, 226.3, 67.3

(56) References Cited

U.S. PATENT DOCUMENTS

| | | | |
|---|---|---|---|
| 4,272,719 A | * 6/1981 | Niki et al. | ..................... 324/72 |
| 4,477,770 A | * 10/1984 | Tojo | ........................... 324/57 N |
| 4,859,933 A | * 8/1989 | Taylor et al. | .............. 324/77 R |
| 5,025,208 A | * 6/1991 | Danzeisen | ................. 324/77 R |
| 5,430,392 A | * 7/1995 | Matejic | ....................... 324/113 |

* cited by examiner

Primary Examiner—N. Le
Assistant Examiner—Etienne LeRoux
(74) Attorney, Agent, or Firm—Oliff & Berridge, PLC

(57) ABSTRACT

The object of the present invention is to provide an electromagnetic noise measurement apparatus, electromagnetic noise measurement method and recording medium capable of preventing erroneous measurement of electromagnetic noise and of enhancing measurement efficiency. An electromagnetic noise measurement apparatus includes a PC, a field intensity meter, a spectrum analyzer, a preamplifier, a controller, a printer and the like. The controller is connected to a turn table for turning an electromagnetic noise measurement target, e.g., a copying machine, and to an antenna elevator for elevating an antenna for measuring electromagnetic noise radiated from the copying machine. The controller controls the turn table and the antenna elevator according to command of the PC. The PC compares a QP value acquired by the field intensity meter with a peak level acquired by the spectrum analyzer, and displays an error message if the difference between the QP value and the peak level is large.

10 Claims, 24 Drawing Sheets

F I G. 1 7
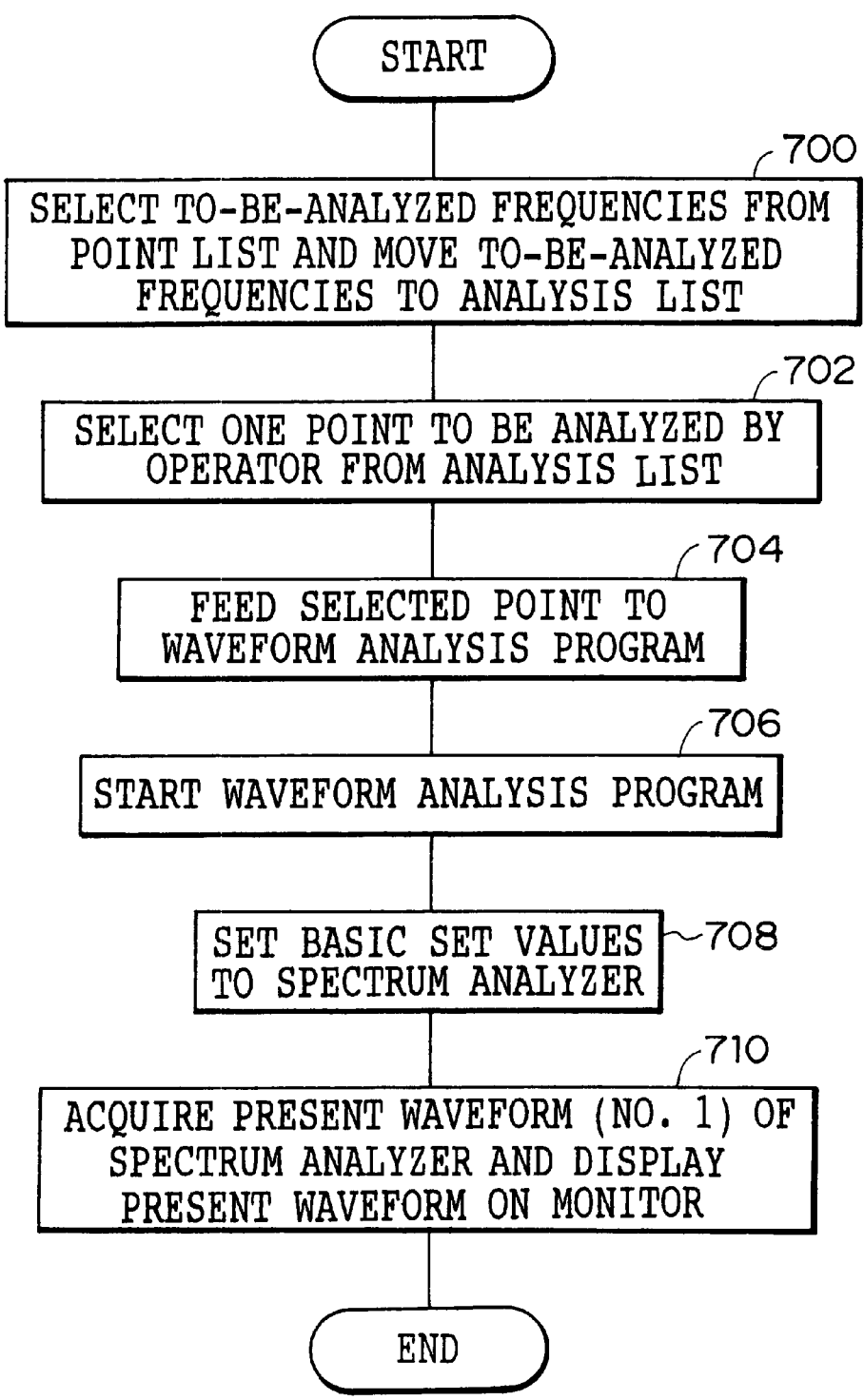

ELECTROMAGNETIC NOISE MEASUREMENT APPARATUS, ELECTROMAGNETIC NOISE MEASUREMENT METHOD AND RECORDING MEDIUM

BACKGROUND OF THE INVENTION

1. Field of the Invention

The present invention relates to an electromagnetic noise measurement apparatus, an electromagnetic noise measurement method and a recording medium. More particularly, the present invention relates to an electromagnetic noise measurement apparatus and an electromagnetic noise measurement method for measuring electromagnetic noise radiated from electronic equipment, as well as a recording medium.

2. Description of the Related Art

Recently, as electric equipment and electronic equipment spreads, electromagnetic interference becomes an object of social concern. To deal with this problem, a standard (VCCI or FCC) is set in each country. It is required to satisfy these standards when apparatuses are put on the market.

To judge whether or not electric equipment or electronic equipment conforms to an EMI standard, it is necessary to measure electromagnetic noise radiated from the equipment and to check if a measurement value is below a standard value. The electromagnetic noise measurement is usually made in a range of 30 $MH_z$ to 1 $GH_z$.

A determination as to whether a product conforms to the EMI standard is made based on the result of a quasi-peak measurement. This quasi-peak measurement requires fixed measurement time, and measurement efficiency deteriorates if the measurement is made in a range of 30 $MH_z$ to 1 $GH_z$. For these reasons, the quasi-peak measurement method is not popular.

At an ordinary electromagnetic wave measurement facility (open field test site or the like), a peak is measured by using a spectrum analyzer instead of executing a quasi-peak measurement in a regulated frequency range. During the measurement, it is checked whether or not this peak conforms to a corresponding standard value. As for an interference signal which does not have a sufficient margin of allowable values, a quasi-peak is measured.

In order to measure the maximum value of electromagnetic waves radiated from an apparatus such as electric equipment or electronic equipment, such a measurement facility further requires a means for turning the measurement target apparatus (apparatus to be measured) and a means for elevating an antenna which receives electromagnetic waves radiated from the measurement-target apparatus.

Further, if conventional automatic electromagnetic wave measurement software is employed, the electromagnetic noise of an apparatus is measured while a reception antenna is fixed to a predetermined position based on a calculation formula using an antenna, which formula is referred to as a height pattern, or on an actual measurement value obtained by using a transmission-reception antenna, so as to efficiently carry out the software operation.

However, if an electromagnetic interference wave has a high directivity toward the height direction of the antenna and electromagnetic waves are measured with the antenna set at a fixed height, the electromagnetic interference wave which should be measured sometimes cannot be measured.

An electromagnetic wave measurement apparatus used at the above-stated electromagnetic wave measurement facility is constituted by connecting, with coaxial cables or the like, an antenna for receiving electromagnetic interference waves generated respectively from electric equipment and electronic equipment, an amplifier amplifying the respective electromagnetic waves received by the antenna, a spectrum analysis means for displaying the results of the received electromagnetic waves, a field intensity meter and the like. To check whether or not the electromagnetic interference waves are below a standard value, it has been necessary that electromagnetic interference wave input and output gains and losses (factors) on the respective parts are calculated, and the calculated factors are offset from the electromagnetic waves received on the respective parts to thereby check that each measurement value is less than the standard value. In addition, no consideration has been given to electromagnetic noise signal generation timing which differs according to measurement target apparatuses and to temporarily observed noise.

Moreover, these gains and losses have been measured and managed at a predetermined signal level which is greatly different from the levels of electromagnetic noises emitted from the actual measurement target apparatuses. In this case, output linearity relative to changes in the magnitude of inputs is not examined. While a factor with respect to a certain input is precise, a factor with respect to variable inputs tends to be imprecise, with the result that measurement values cannot be often compared with the standard value.

Meanwhile, according to the standard regarding the above-stated electromagnetic noise, it is required to measure a QP (quasi-peak) and to judge whether or not this Qp measurement value satisfies a standard value. With the above-stated electromagnetic interference evaluation method, radiated noise is measured, electromagnetic wave levels with various frequencies are respectively measured, electromagnetic wave levels corresponding to the harmonic components of a specific repetition signal among a plurality of repetition signals of the apparatus are automatically extracted from the measurement results and a QP measurement is automatically made. If the respective harmonic components of the specific repetition signal overlap those of a different repetition signal with the same frequency or if the harmonic components of the specific repetition signal are adjacent to those of the different repetition signal, the automatic QP measurement of a measurement target harmonic may sometimes cause an error.

Further, if a measurement system receives a signal having an equivalent intensity for the level of electromagnetic noise radiated from a measurement target apparatus, the measurement system does not always exhibit linearity performance and errors may possibly occur to a measurement result.

SUMMARY OF THE INVENTION

The present invention has been made to solve the above-stated disadvantages. It is, therefore, an object of the present invention to provide an electromagnetic noise measurement apparatus, an electromagnetic noise measurement method and a recording medium, which are capable of preventing erroneous measurement of electromagnetic noise and of enhancing measurement efficiency.

To achieve the above object, a first aspect of the present invention is an electromagnetic noise measurement apparatus for measuring electromagnetic noise radiated from an equipment to be measured, the apparatus including: an antenna for receiving the electromagnetic noise; a peak field intensity measuring section which receives the electromagnetic noise from the antenna and measures a peak field intensity of the electromagnetic noise in a predetermined frequency range; a quasi-peak measuring section which receives the electromagnetic noise from the antenna and measures a quasi-peak of the electromagnetic noise at a specific frequency determined in advance; and an informing section which receives measurement results from the peak field intensity measuring section and the quasi-peak measuring section, and, if a difference between a peak field intensity value at the specific frequency and a quasi-peak value at the specific frequency are equal to or more than a predetermined value, informs a predetermined message.

According to this invention, electromagnetic noise radiated from, for example, an electronic equipment (the equipment to be measured) such as, a printer, a copying machine or a facsimile machine or the like, is received by the antenna. When the antenna is to receive the electromagnetic noise, the antenna is moved by an antenna elevating section which elevates the antenna to, for example, a position at which electromagnetic noise is maximized, the electronic equipment is put on a turn table and the electromagnetic noise is received while the turn table turns.

The peak field intensity measuring section measures the peak field intensity of the electromagnetic noise received by this antenna in a predetermined frequency range. For the peak field intensity measuring section, a well-known spectrum analyzer, for example, can be used.

The quasi -peak measuring section measures the quasi -peak, i.e., QP value, of the electromagnetic noise received by the antenna at a preset frequency (a specific frequency determined in advance). For the quasi-peak measuring section, a well-known field intensity meter (receiver), for example, can be used. The preset frequency refers to, for example, a frequency of the electromagnetic noise at which the peak field intensity exceeds a predetermined threshold value. A setting section may be also provided, at which the specific frequency for the quasi-peak measuring section may be set on the basis of peak field intensity of the electromagnetic noise measured by the peak field intensity measuring section and the predetermined frequency range. This setting may be made manually by an operator or automatically by automatic detection of frequencies of the electromagnetic noise which exceed the predetermined threshold of the peak field intensity.

Meanwhile, in the QP measurement, a sharp peak waveform which does not continue for a predetermined duration specified by a standard cannot be measured. As a result, if measurement conditions of the peak field intensity measuring section and the quasi-peak measuring section differ for some reason, there is a possibility that a value measured by the quasi-peak measuring section while automatically measuring the QP value is not correct, which situation will cause erroneous measurement.

Considering the above, the informing section informs by, for example, displaying an error message indicating that the measurement should be made manually on the display section, in a case where the difference between the peak field intensity and the quasi-peak is equal to or greater than a predetermined value at the specific frequency. Consequently, it is possible to prevent erroneous measurement even if the QP measurement is made automatically.

Clock frequencies of clocks (clock devices) mounted on respective substrates of the electronic equipment may be stored in a storage section in advance as a clock list. A waveform at a frequency of an integer multiple of a clock selected from this clock list, i.e., a harmonic waveform, may be superposed on a noise waveform of a preset frequency and displayed on the display section. As a result, it is possible to easily specify a clock whose substrate is a noise source.

Further, the display section may display waveforms of a plurality of frequencies, a calculation section may calculate a difference between the waveforms of the plurality of frequencies and the waveform of a preset basic frequency and a calculation result may be stored in a storage section. As a result, it is possible to easily compare a waveform of electromagnetic noise measured at, for example, electronic equipment provided with a substrate for which counter-measures against electromagnetic noise have not been taken yet, with a waveform of electromagnetic noise measured at electronic equipment provided with a substrate for which counter-measures against electromagnetic noise have been taken. Further, the electromagnetic noise on the substrate may be assigned different colors according to levels and displayed in a three-dimensional style.

Further, to achieve the above object, a second aspect of the present invention is an electromagnetic noise measurement method for measuring electromagnetic noise radiated from an equipment to be measured, the method including the steps of: receiving the electromagnetic noise by an antenna; measuring a peak field intensity of the electromagnetic noise received by the antenna in a predetermined frequency range; measuring a quasi-peak of the electromagnetic noise received by the antenna at a specific frequency determined in advance; and informing a predetermined message if a difference between a peak field intensity value at the specific frequency and a quasi-peak value at the specific frequency are equal or more than a predetermined value. Accordingly, it is possible to prevent erroneous measurement of the electromagnetic noise.

Furthermore, to achieve the above object, a third aspect of the present invention is a computer-readable recording medium at which is recorded a program for controlling measurement of electromagnetic noise radiated from an equipment to be measured, wherein the program causes a computer to execute a process including the steps of: receiving the electromagnetic noise by an antenna; measuring a peak field intensity of the electromagnetic noise received by the antenna in a predetermined frequency range; measuring a quasi-peak of the electromagnetic noise received by the antenna at a specific frequency determined in advance; and informing a predetermined message if a difference between a peak field intensity value at the specific frequency and a quasi-peak value at the specific frequency are equal or more than a predetermined value. Accordingly, it is possible to prevent erroneous measurement of the electromagnetic noise.

To achieve the above object, a fourth aspect of the present invention is an electromagnetic noise measurement apparatus for measuring electromagnetic noise radiated from an equipment to be measured, the apparatus including: a signal generating section for generating a signal corresponding to the electromagnetic noise; a plurality of processing sections connected in series, for being inputted the signal from the signal generating section and for performing predetermined processes; a comparing section for comparing a field intensity level of the signal outputted from the signal generating section with at least one of processed signals which are processed by the plurality of processing sections; and a display section for displaying a comparison result of the comparing section.

According to the fourth aspect, the signal generating section generates a signal which replaces the electromagnetic noise radiated from the equipment to be measured (for example, an electronic equipment). This signal is inputted into a plurality of processing sections connected in series, e.g., an amplifier for amplifying a signal received by the antenna and a spectrum analyzer, or the amplifier and a field intensity meter, and processed therein.

The processing sections mentioned above individually have linear input and output characteristics. However, there are cases where, if these sections are connected in series and regarded as a single processing section, linear input and output characteristics cannot be obtained.

In view of the above, the comparing section compares the field intensity level of the signal outputted from the signal generating means with that of the signal which has been processed by the plurality of processing means, and the comparison result is displayed on the display section. As a result, it is possible to easily check the linearity of the plurality of processing sections for measuring the electromagnetic noise. It is, therefore, possible to accurately measure the electromagnetic noise.

BRIEF DESCRIPTION OF THE DRAWINGS

FIG. 12 is a flow chart for measuring electromagnetic waves in the the embodiment;

FIG. 17 is a flow chart for measuring electromagnetic waves in the fourth embodiment according to the present invention;

DESCRIPTION OF THE EMBODIMENTS OF THE INVENTION

First Embodiment

The first embodiment according to the present invention will be described.

Figure 1:
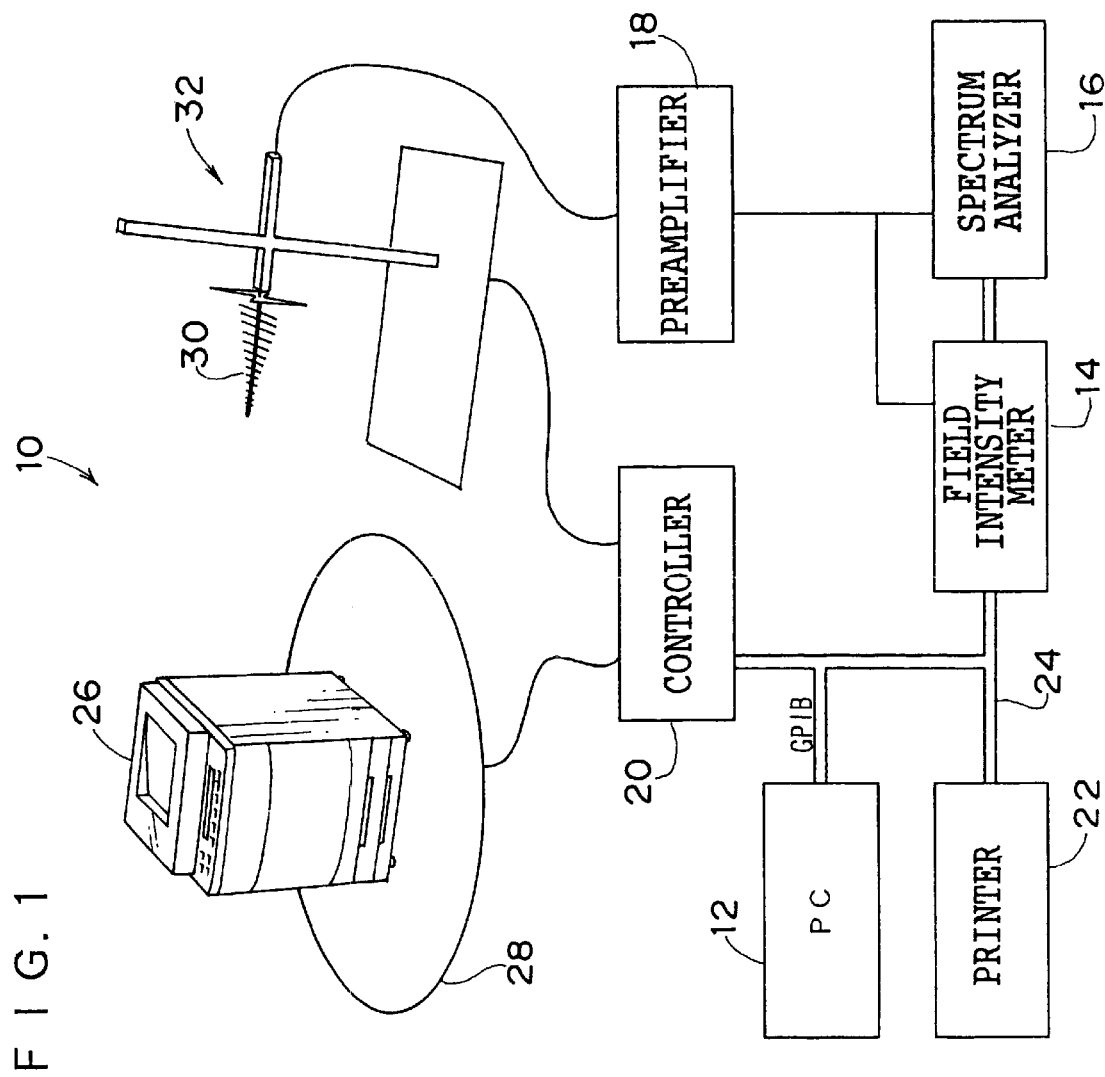
FIG. 1 is a schematic block diagram of an electromagnetic wave measurement apparatus in the first embodiment according to the present invention.

FIG. 1 shows an electromagnetic noise measurement apparatus 10. As shown in FIG. 1, the electromagnetic noise measurement apparatus 10 comprises a personal computer (PC) 12, a field intensity meter 14, a spectrum analyzer 16, a preamplifier 18, a controller 20, a printer 22 and the like. The PC 12, the field intensity meter 14, the spectrum analyzer 16, the controller 20 and the printer 22 are connected to one another by CPIB cables 24.

The controller 20 is connected to an antenna elevator 32 for elevating an antenna 30 for measuring electromagnetic noise radiated from a turn table 28 turning an electromagnetic noise measurement target such as a copying machine 26, and from the copying machine 26. The controller 20 controls the turn table 28 and the antenna elevator 32 according to a command of the PC 12.

Next, description will be given to the measurement (EMI measurement) of electromagnetic noise radiated from the copying machine 26.

Figure 2:
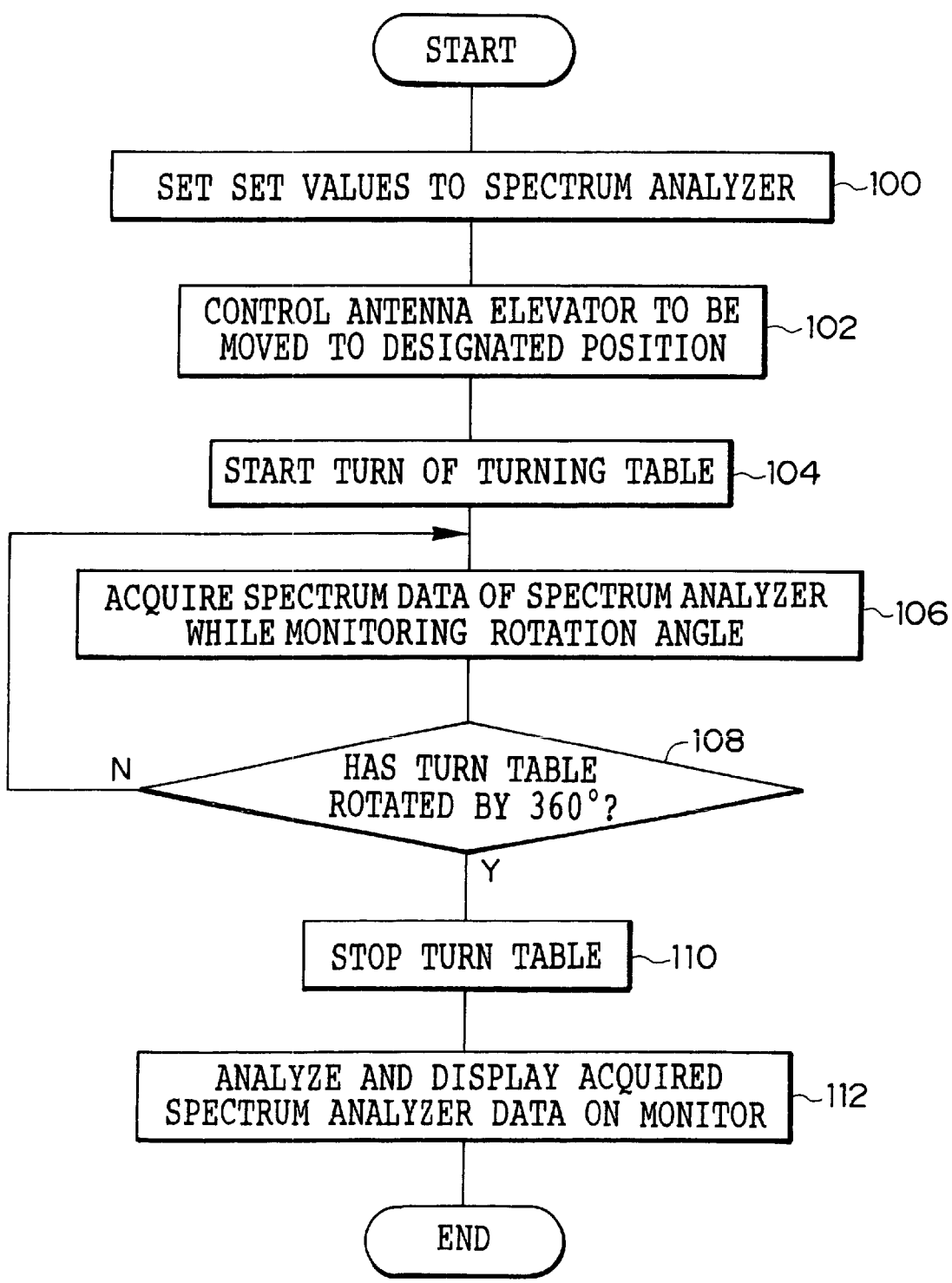
FIG. 2 is a flow chart for measuring electromagnetic waves in the first embodiment.

FIG. 2 is a flow chart for an EMI (electromagnetic interference) software for measuring electromagnetic interference noise radiated from the copying machine 26.

As shown in FIG. 2, in case of measuring electromagnetic noise, an operator sets predetermined set values to the spectrum analyzer 16 (in a step 100).

Next, the antenna elevator 32 is controlled by the controller 20 according to a command of the PC 12 and the antenna 30 is moved to a designated position (in a step 102). This designated position is a position at a height at which the electric field of the composition of the direct wave of the electromagnetic noise radiated from, for example, the copying machine 26 and the electromagnetic noise of reflected wave reflected by a floor become the highest.

Accordingly, to install the antenna 30 at this designated position, the antenna 30 is elevated while the turn table 28, for example, is set to have a predetermined angle, and the elevation of the antenna 30 is stopped at a position at which the electric field of the electromagnetic noise measured by the field intensity meter 14 becomes the highest. In this way, the antenna 30 is moved to a position at which the electromagnetic noise from the copying machine 26 becomes the greatest.

Figure 3:
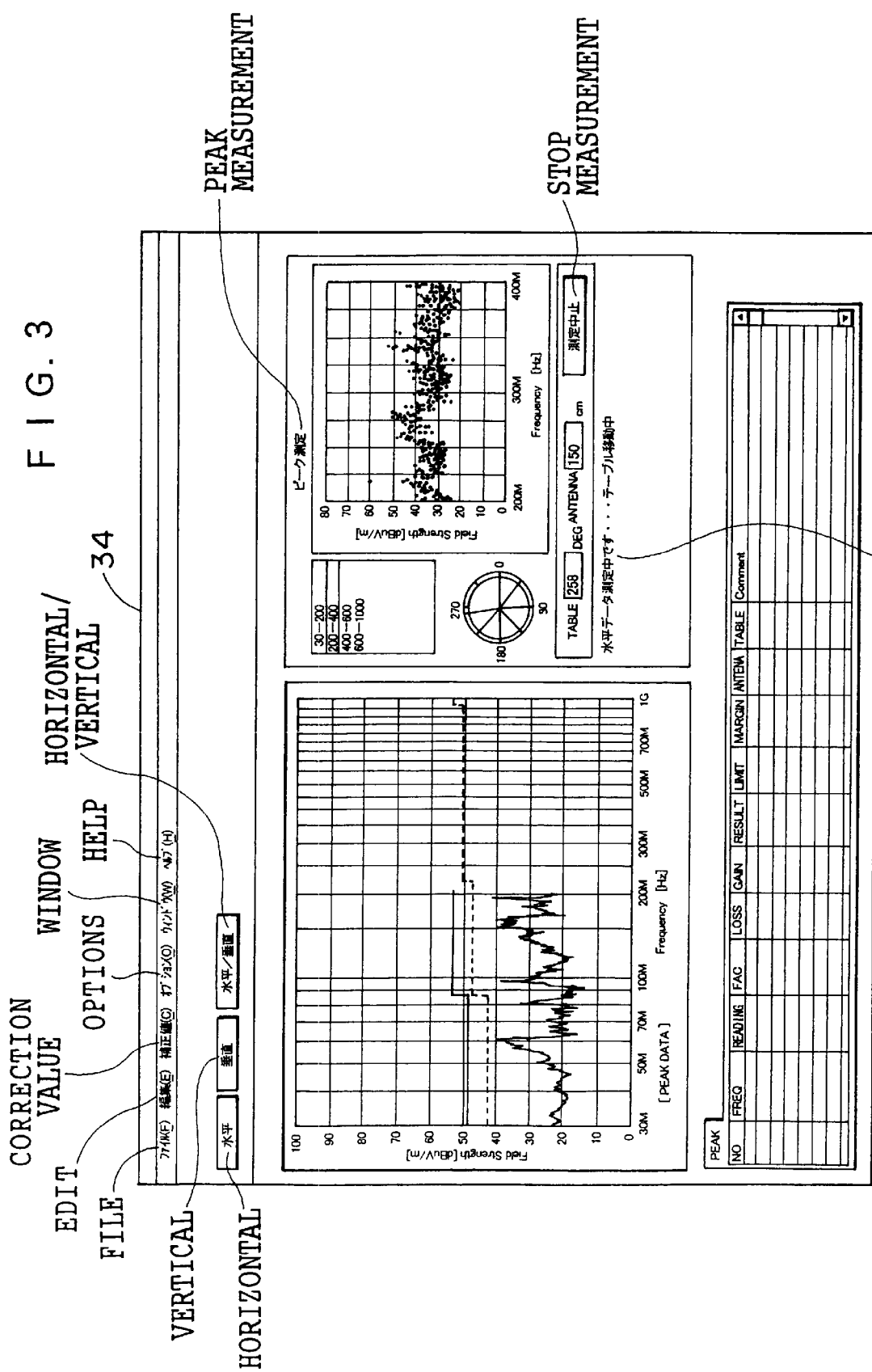
FIG. 3 is an example view of a picture plane displayed in the electromagnetic measurement in the first embodiment.

After moving the antenna 30 as stated above, the controller 20 starts turning the turn table 28 according to a command of the PC 12 (in a step 104). While monitoring the rotation angle of the table 28, spectrum data on electromagnetic noise is acquired from the spectrum analyzer 16 and stored in a memory provided in the PC 12. At the same time, as shown in FIG. 3, the acquired data is displayed on the monitor 34 of the PC 12.

Then, it is judged whether or not the turn table 28 has turned by 360 degrees (in a step 108). If the turn table 28 has turned by 360 degrees, the table 28 is stopped (in a step 110).

Figure 4:
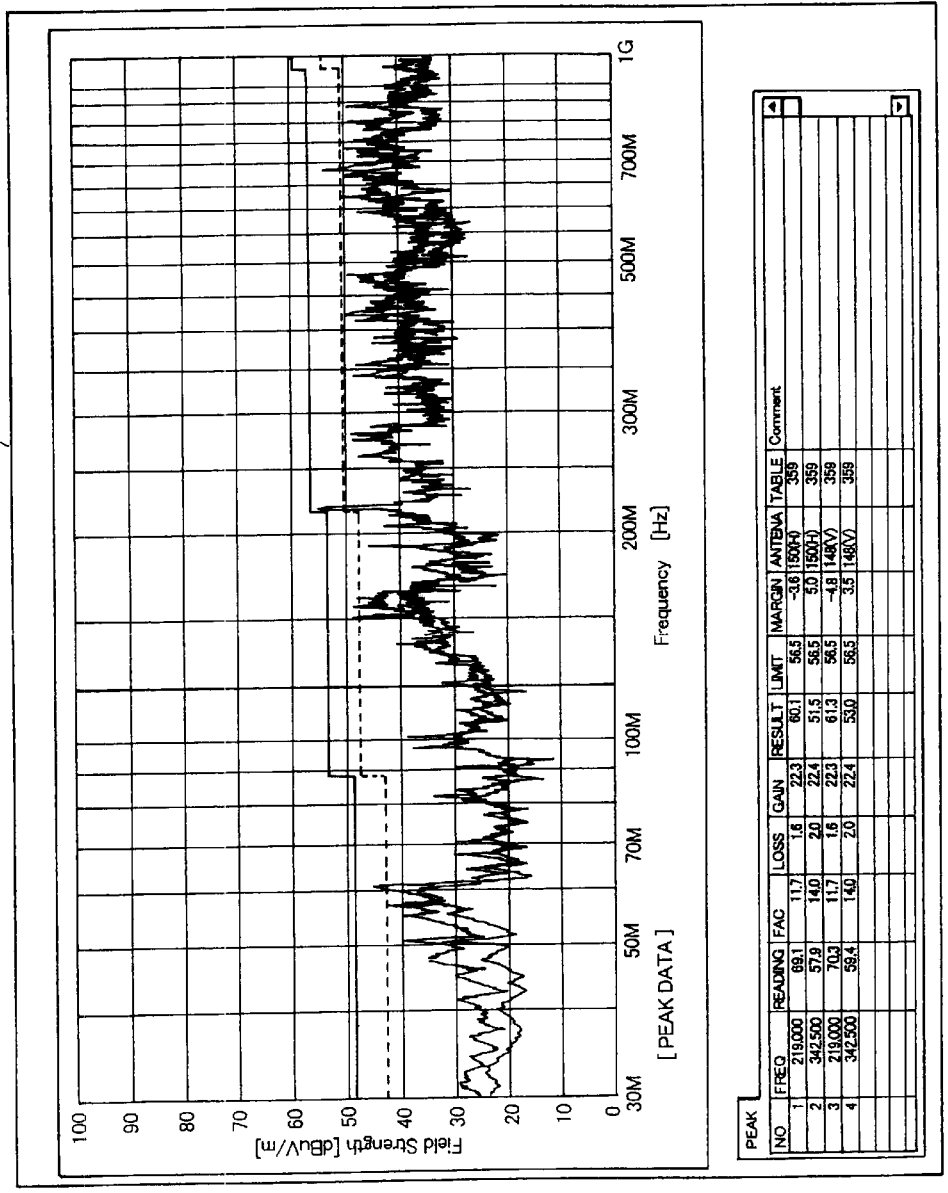
FIG. 4 is an example view of a picture plane displayed in the electromagnetic measurement in the first embodiment.

Thereafter, the acquired data of the spectrum analyzer 16 is analyzed and displayed on the monitor 34 of the PC 12 as shown in FIG. 4 (in a step 112). FIG. 4 shows a waveform with frequencies of 30 MHz to 1 GHz.

Figure 6:
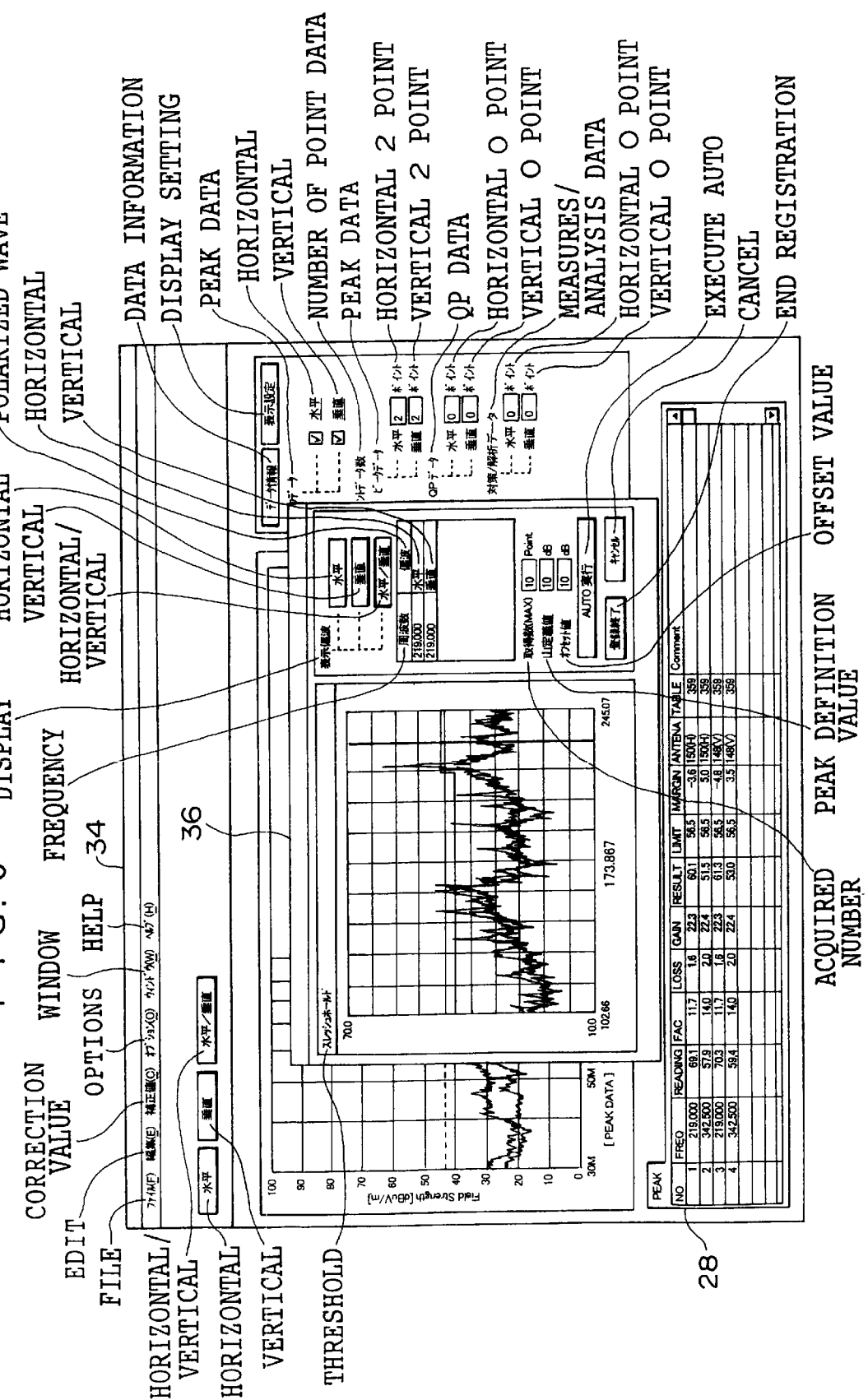
FIG. 6 is an example view of a picture plane displayed in the electromagnetic measurement in the first embodiment.
Figure 7:
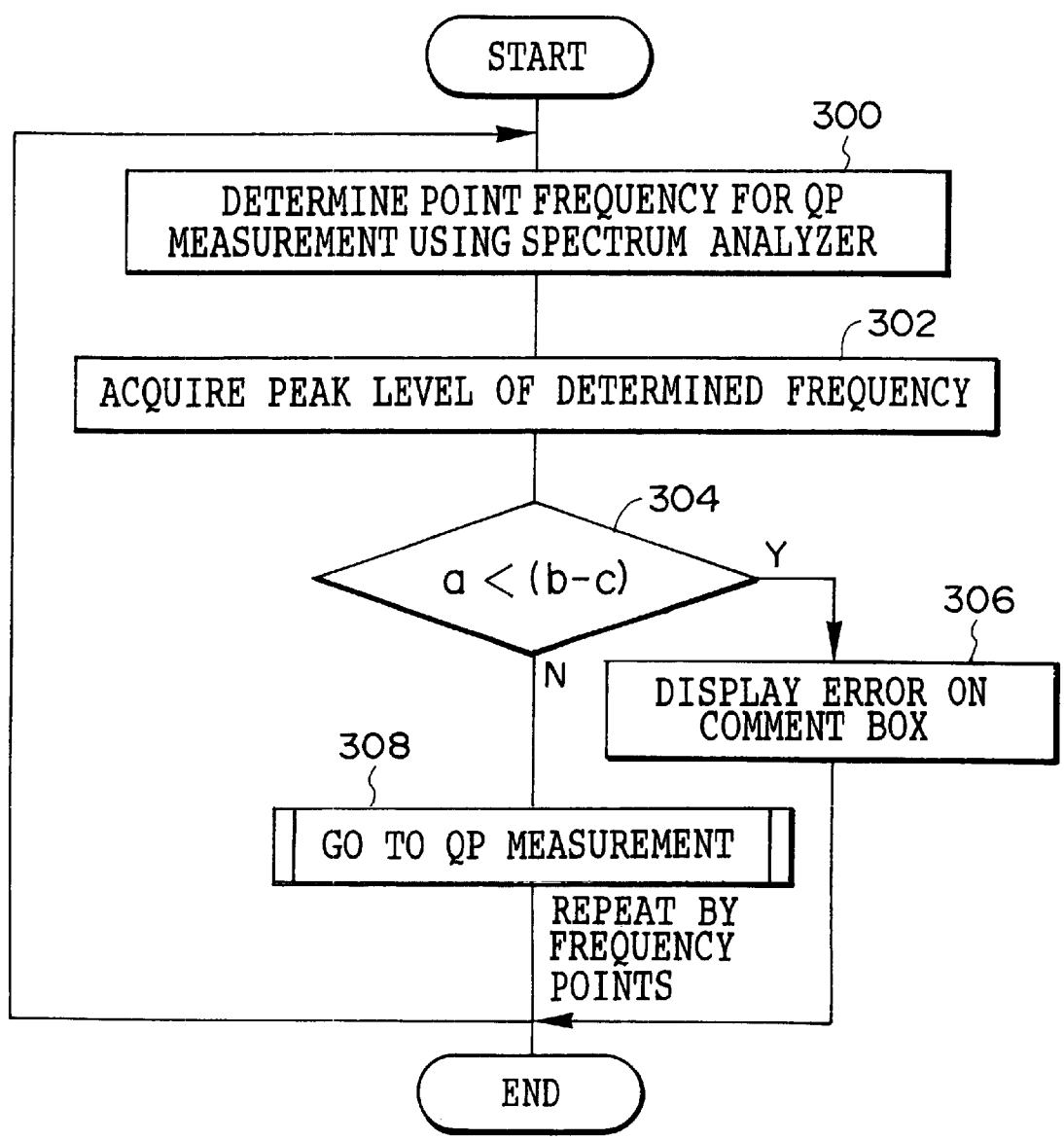
FIG. 7 is flow chart for measuring electromagnetic waves in the first embodiment.

Next, as shown in FIG. 4, the operator designates a frequency range to be analyzed from the spectrum data displayed on the monitor 34 of the PC 12 (in a step 200) by using a mouse or a keyboard of the PC 12. As a result, the waveform in the designated frequency range is displayed in an enlarged manner on a different window 36 as shown in FIG. 6 (in a step 202).

The operator designates a frequency point to be analyzed, e.g., a frequency point at which an electric field level is equal to or higher than a predetermined threshold value, from the waveform enlarged and displayed on the window 36 (in a step 204). By doing so, data on the designated frequency point is displayed on a point list 28 shown in FIG. 6 (in a step 206).

Using the spectrum analyzer 16, a point (frequency) with which a QP measurement is made is determined (in a step 300) and the peak level of the determined frequency is acquired (in a step 302).

Figure 5:
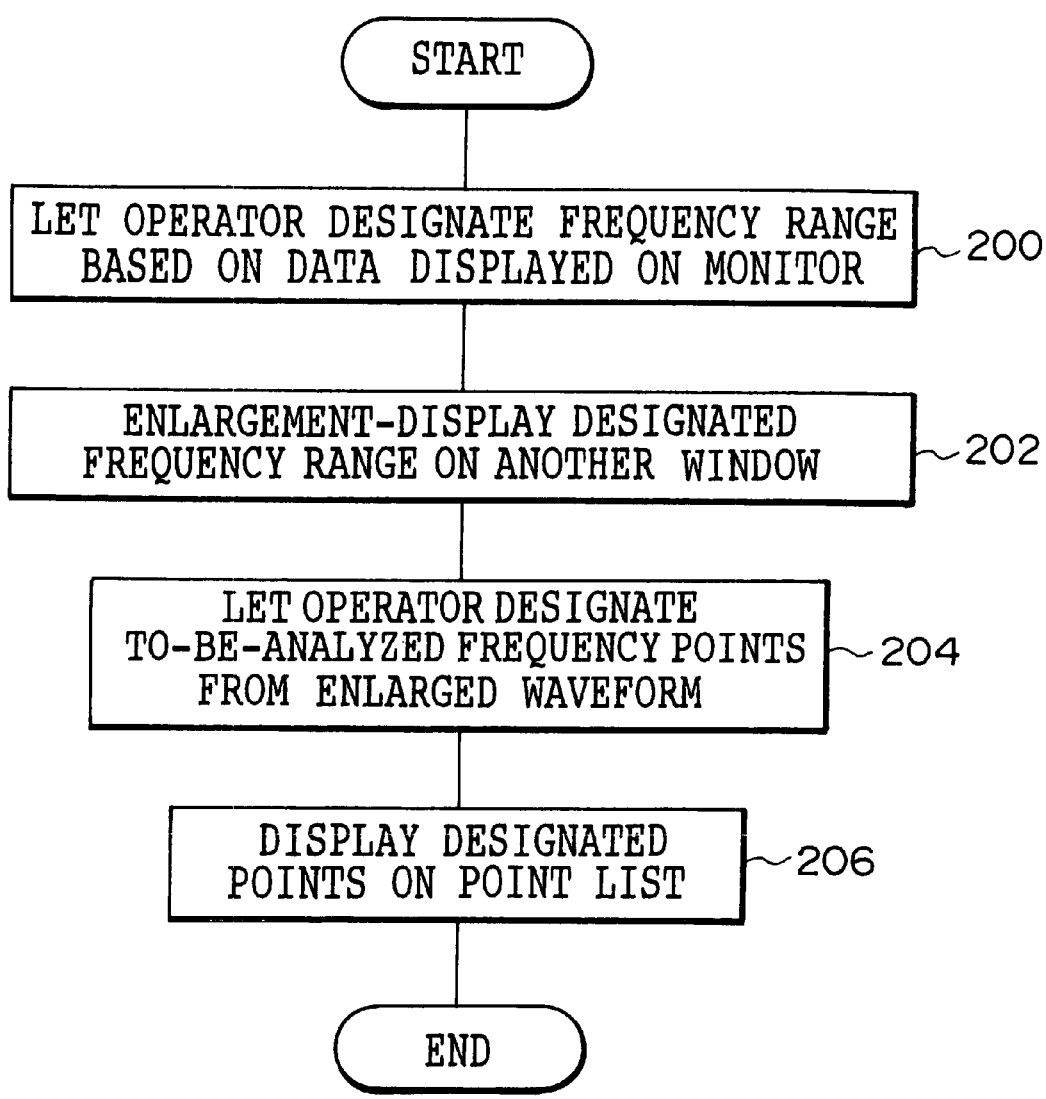
FIG. 5 is a flow chart for measuring electromagnetic waves in the first embodiment.

While assuming that the peak level acquired by the spectrum analyzer 16 is "a", the peak level of the point designated in the step 204 shown in FIG. 5 is "b" and a preset uncertain value is "c", it is judged whether "a", "b" and "c" satisfy the relationship of a<b–c (in a step 304). If a <b–c, it is judged that the designated point is electromagnetic noise which varies with the passage of time (electromagnetic noise having different peak levels depending on measurement timing) and cannot be automatically measured, and an indication that the point should be measured manually is displayed as an error message on a comment box on the point list 28 (in a step 306). By doing so, it is possible to prevent erroneous measurement.

Figure 8:
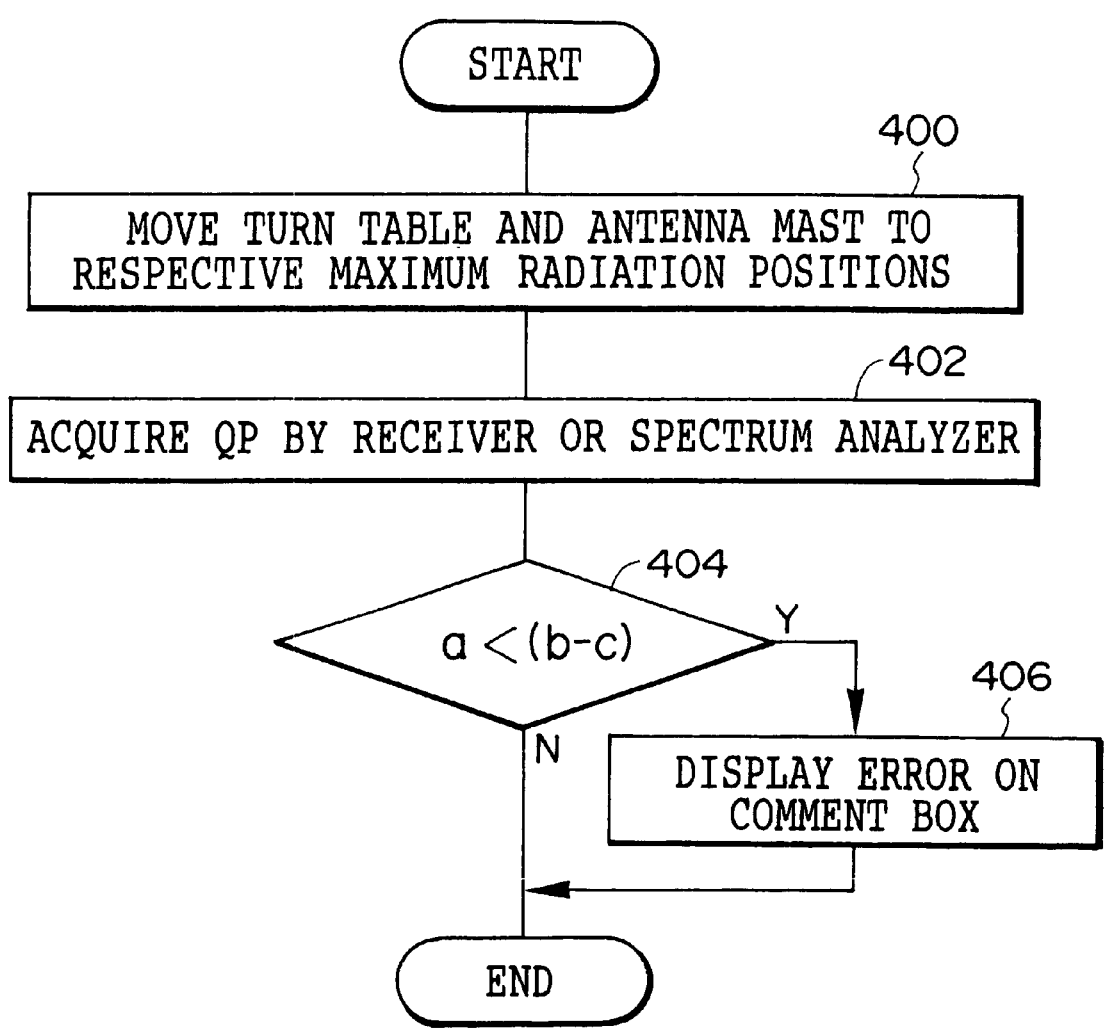
FIG. 8 is flow chart for measuring electromagnetic waves in the first embodiment.

On the other hand, if "a", "b", and "c" do not satisfy the relationship of a<b–c, it is judged that the designated point is electromagnetic noise which can be automatically measured, and a QP measurement is conducted as shown in FIG. 8 (in a step 308).

In the QP measurement, as shown in FIG. 8, the turn table 28 and the antenna 30 are first moved to respective positions at which the electromagnetic noise become the maximum (in a step 400). Then, a QP value is acquired by means of either the field intensity meter 14 or the spectrum analyzer 16 (in a step 402).

While assuming that the QP acquired from the spectrum analyzer 16 is "a", the peak level of the point designated in the step 204 shown in FIG. 5 is "b" and a preset margin value is "c", it is judged whether or not "a", "b" and "c" satisfies the relationship of a<b–c (in a step 404). If a<b–c, it is judged that the designated point is electromagnetic noise which varies with the passage of time and cannot be measured automatically, and an indication that the point should be measured manually is displayed as an error message on a comment box on the point list 28 (in a step 406). By doing so, it is possible to prevent erroneous measurement. On the other hand, if "a", "b", and "c" does not satisfy a<b–c, then returned, and the above-stated operation is carried out to the other determined frequency.

As can be seen from the above, it is judged whether or not the designated point is electromagnetic noise which varies with the passage of time and cannot be measured automatically. If it is judged that the point cannot be measured automatically, an error message is displayed on the monitor 34, whereby it is possible to prevent the erroneous measurement of electromagnetic noise.

Second Embodiment

The second embodiment according to the present invention will be described. In the second embodiment, description will be given to a case of checking linearity with respect to the inputs and outputs of a field intensity meter 14, a spectrum analyzer 16 and a preamplifier 18 of a electromagnetic wave measurement apparatus 10.

Figure 9:
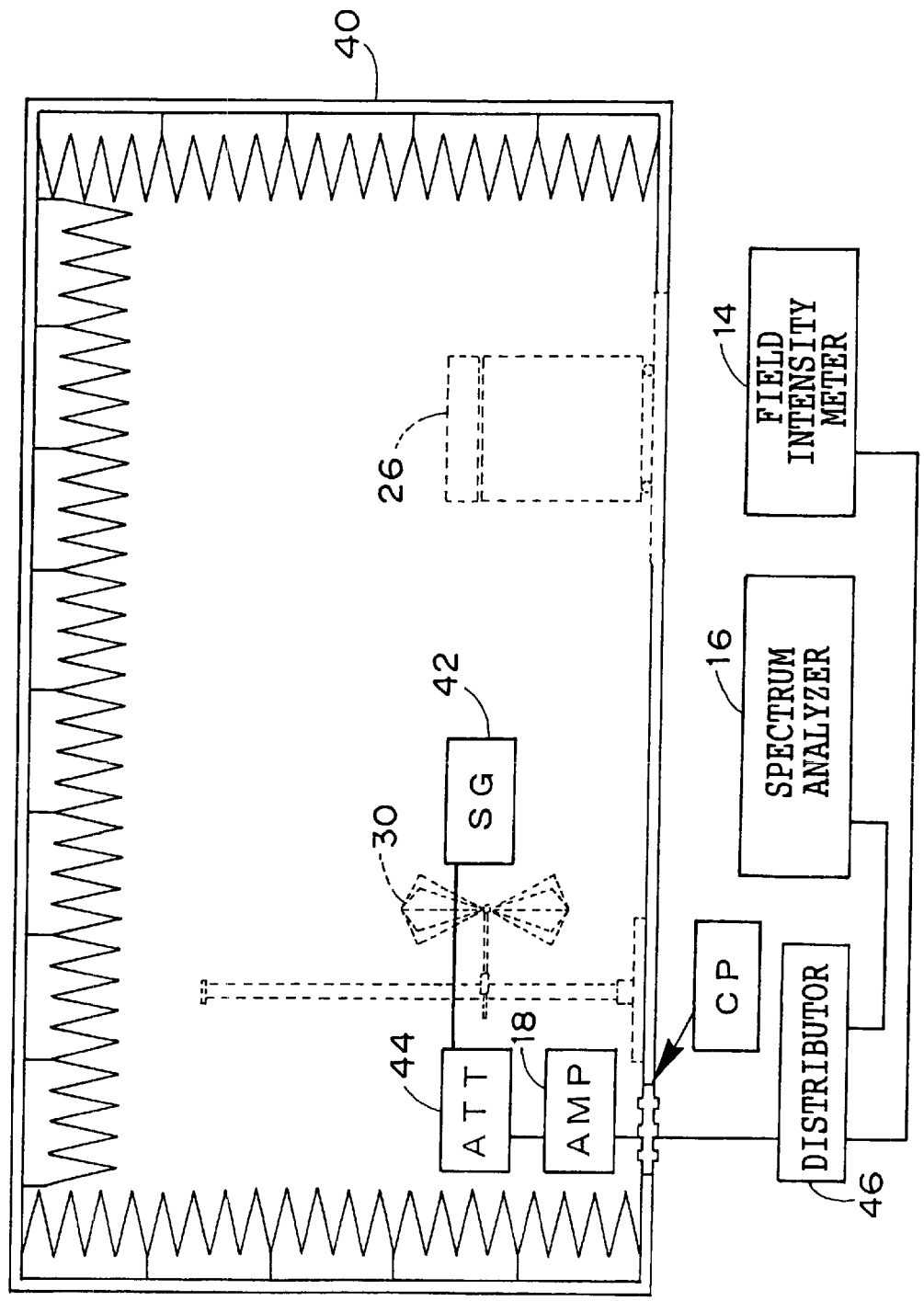
FIG. 9 is a schematic block diagram of an electromagnetic wave measurement apparatus in the second embodiment according to the present invention.

Electromagnetic noise is measured by installing a measurement target copying machine 26 and an antenna 30 in, for example, a radio wave anechoic chamber 40 as shown in FIG. 9. To conduct a linearity check to measuring equipments, a signal generator (SG) 42 for generating a signal instead of the copying machine 26 radiating electromagnetic noise is provided.

A signal from the signal generator 42 is inputted into the preamplifier 18 through an attenuator(ATT) 44 and then inputted into a spectrum analyzer 16 and a field intensity meter 14 by a distributor 46. The linearity check is conducted to, for example, the preamplifier and the spectrum analyzer 16, and the preamplifier 18 and the field intensity meter (receiver) 14.

Now, description will be given to a case of checking the linearity between the preamplifier 18 and the receiver 14 with reference to a flow chart shown in FIG. 10.

Figure 10:
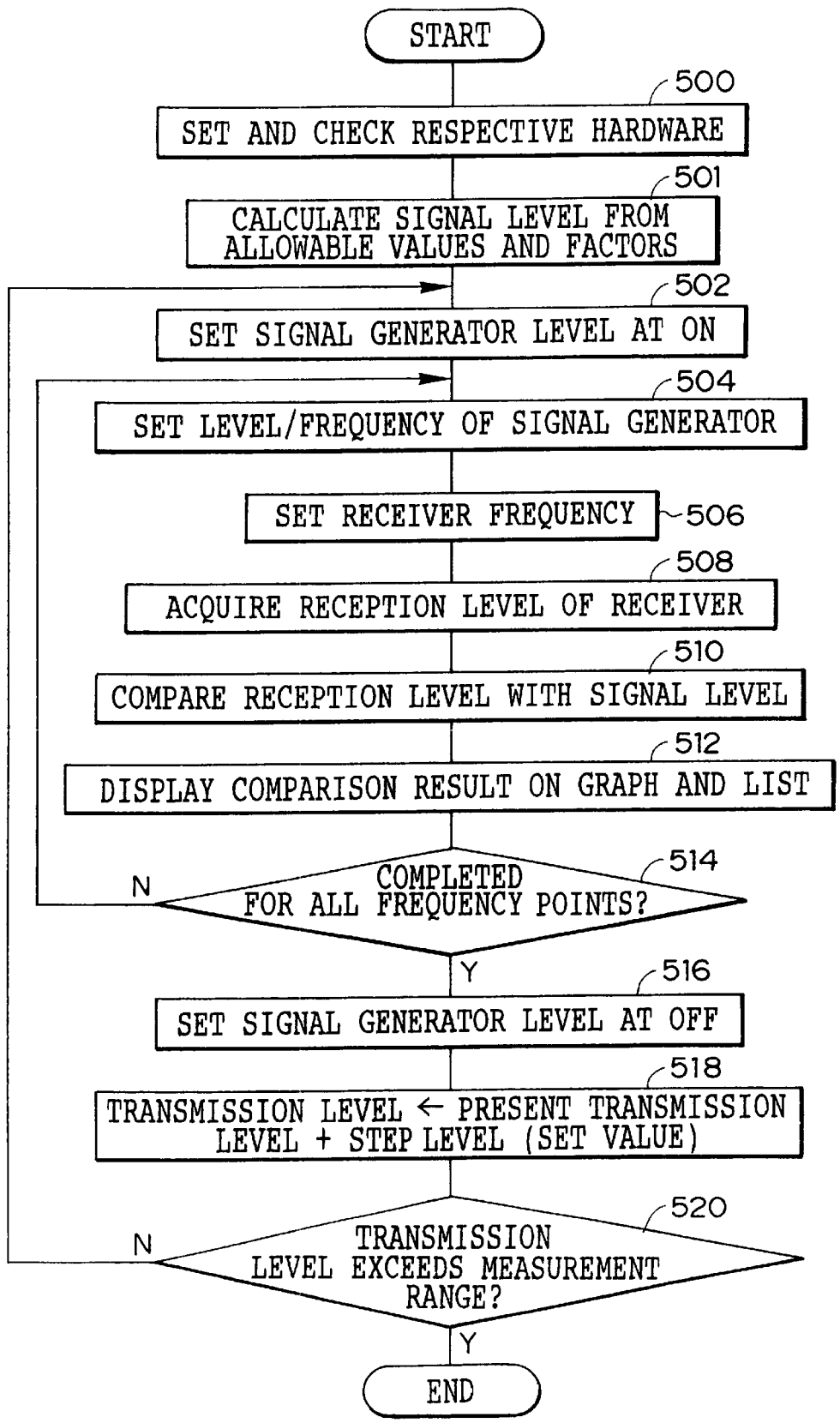
FIG. 10 is a flow chart for measuring linearity in the second embodiment.

As shown in FIG. 10, first, the respective hardware are set and checked (in a step 500). The output level of the signal generator 42 is calculated from allowable values and a factor (in a step 501), the level of the signal generator 42 is set at ON (in a step 502) and the level and frequency of the signal generator 42 are then set (in a step 504).

Next, the frequency of the receiver 14 is set (in a step 506) and the reception level of the receiver 14 is acquired (in a step 508). Then, a comparison result is calculated from the transmission level of the signal generator 42 and the reception level of the receiver 16 (in a step 510).

Figure 11:
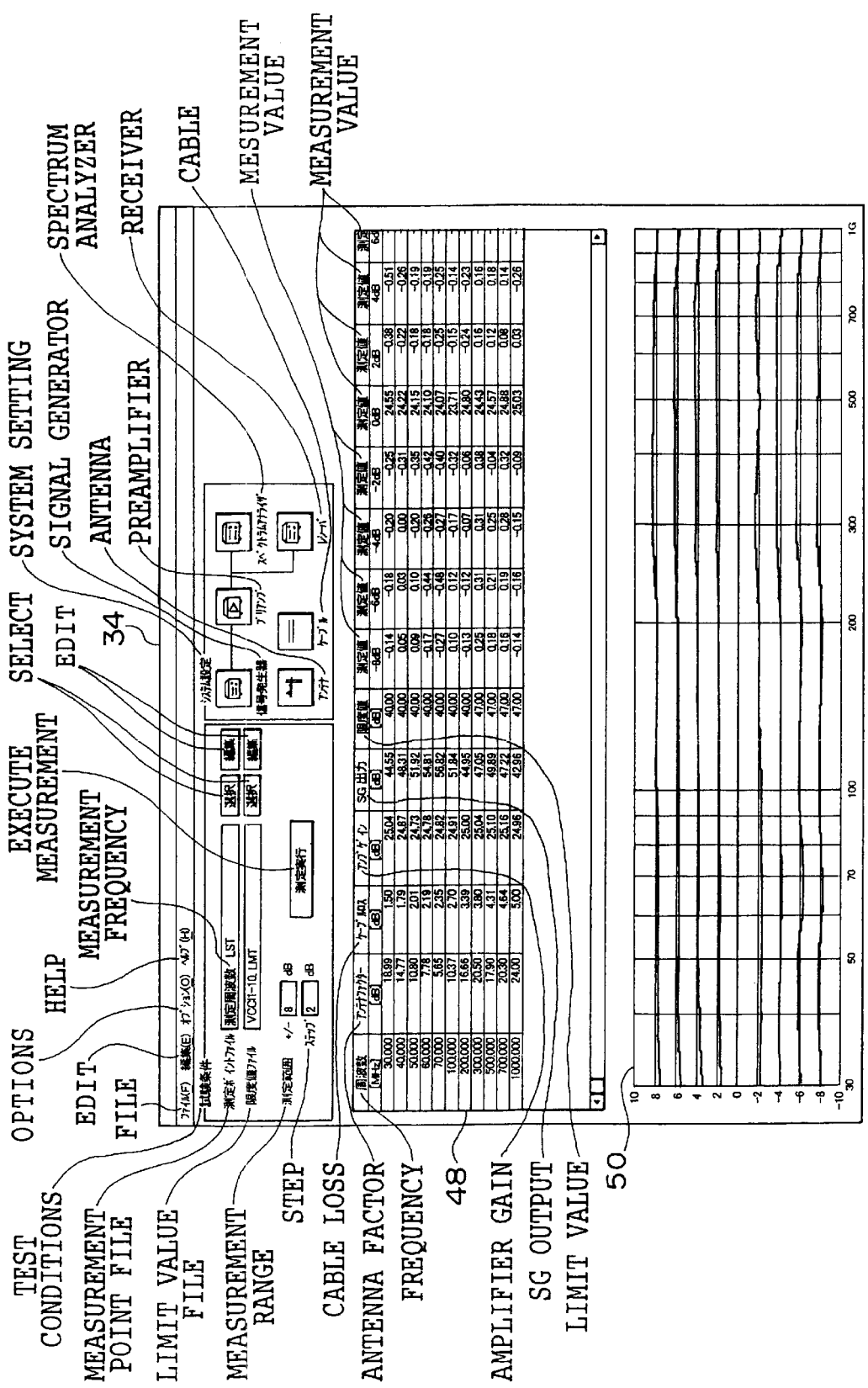
FIG. 11 is an example view of a picture plane displayed in the linearity measurement in the second embodiment.

Thereafter, the acquired comparison value (comparison result) is displayed on a list 48 and a graph 50 shown in FIG. 11 (in a step 512). It is then determined whether or not comparison has been completed for all preset frequency points (in a step 514). The operations of the steps 504 to 512 are repeated until the comparison has been completed for all preset frequency points. If the comparison has been completed for all preset frequency points, the level of the signal generator 42 is set at OFF (in a step 516).

Next, a value obtained by adding a step level (a set value, e.g., 2 db) to the present transmission level of the signal generator 42, is set as a transmission level (in a step 518). It is then judged whether or not the step level added transmission level is out of a preset measurement range (e.g., from "measurement value –10 db" to "measurement value +10 db") (in a step 520). If the transmission level is within the measurement range, the above processings are repeated. If the transmission level is out of the measurement range, the measurement is finished.

As a result, comparison value (deviation) of each of the levels for the respective frequencies are displayed on the graph 50 and the manner of the variation of the comparison value of each of the levels with the respective frequencies, i.e., the linearity between the preamplifier 18 and the receiver 14 can be grasped. Due to this, it is possible to measure electromagnetic noise more precisely.

Third Embodiment

Next, the third embodiment according to the present invention will be described. In the third embodiment, description will be given to a case of specifying which portion of the copying machine 26 is a noise generation source.

Substrates having various clocks are mounted on the copying machine 26. For that reason, a frequency list for the clocks provided on the respective substrates are stored in a memory of the PC 12 in advance. Based on the clock frequency list and measured electromagnetic noise, a noise generation source is specified.

Figure 12:
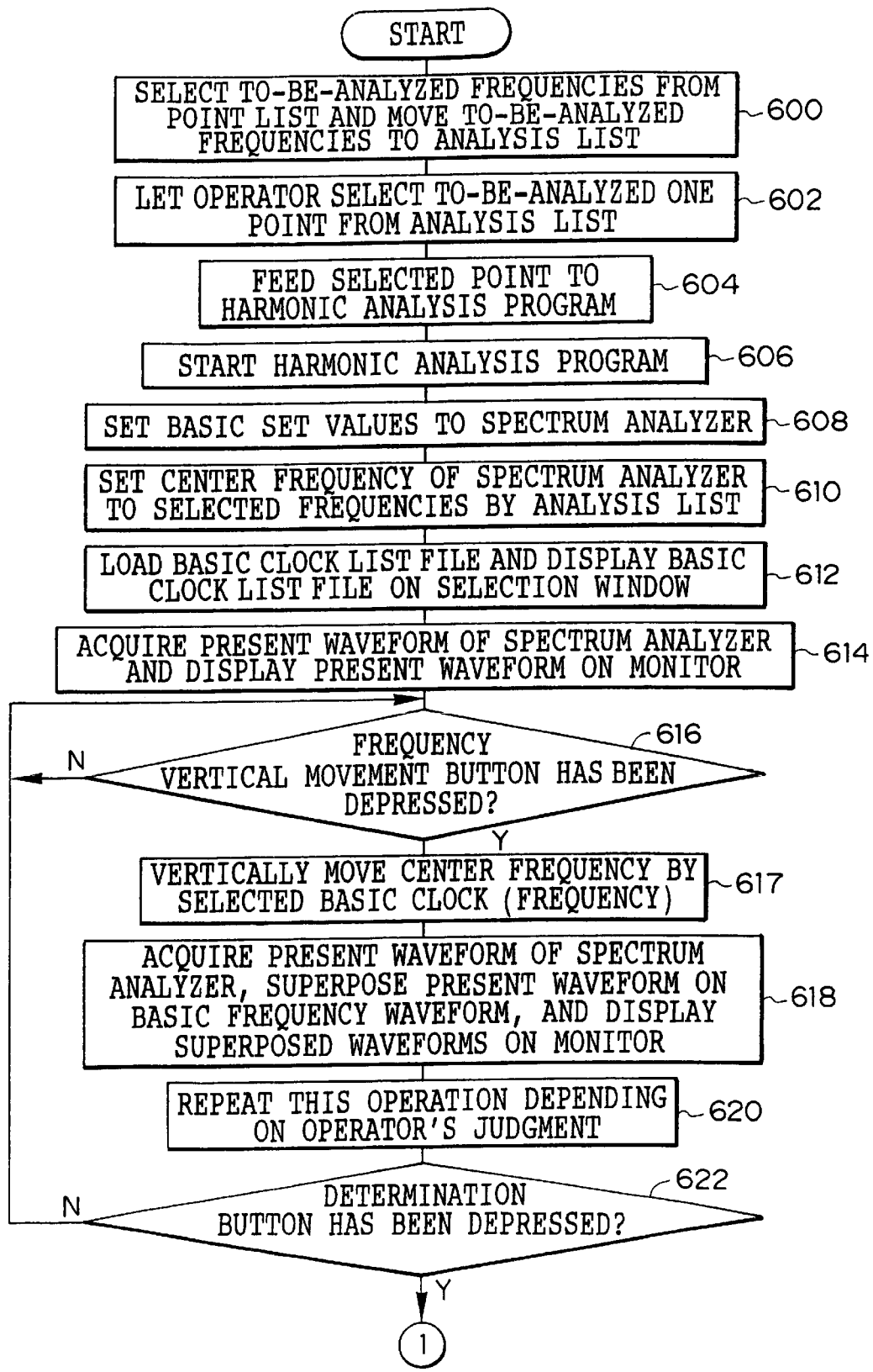
FIG. 12 is a flow chart for measuring electromagnetic waves in the third embodiment according to the present invention.

First, as already described in the first embodiment, electromagnetic noise radiated from the copying machine 26 is measured and the result is displayed on the monitor 34 according to the flow charts shown in FIGS. 2 and 5. Then, analysis target frequencies are selected from the point list 38 and moved to an analysis list (a different software) (in a step 600 shown in FIG. 12).

Figure 14:
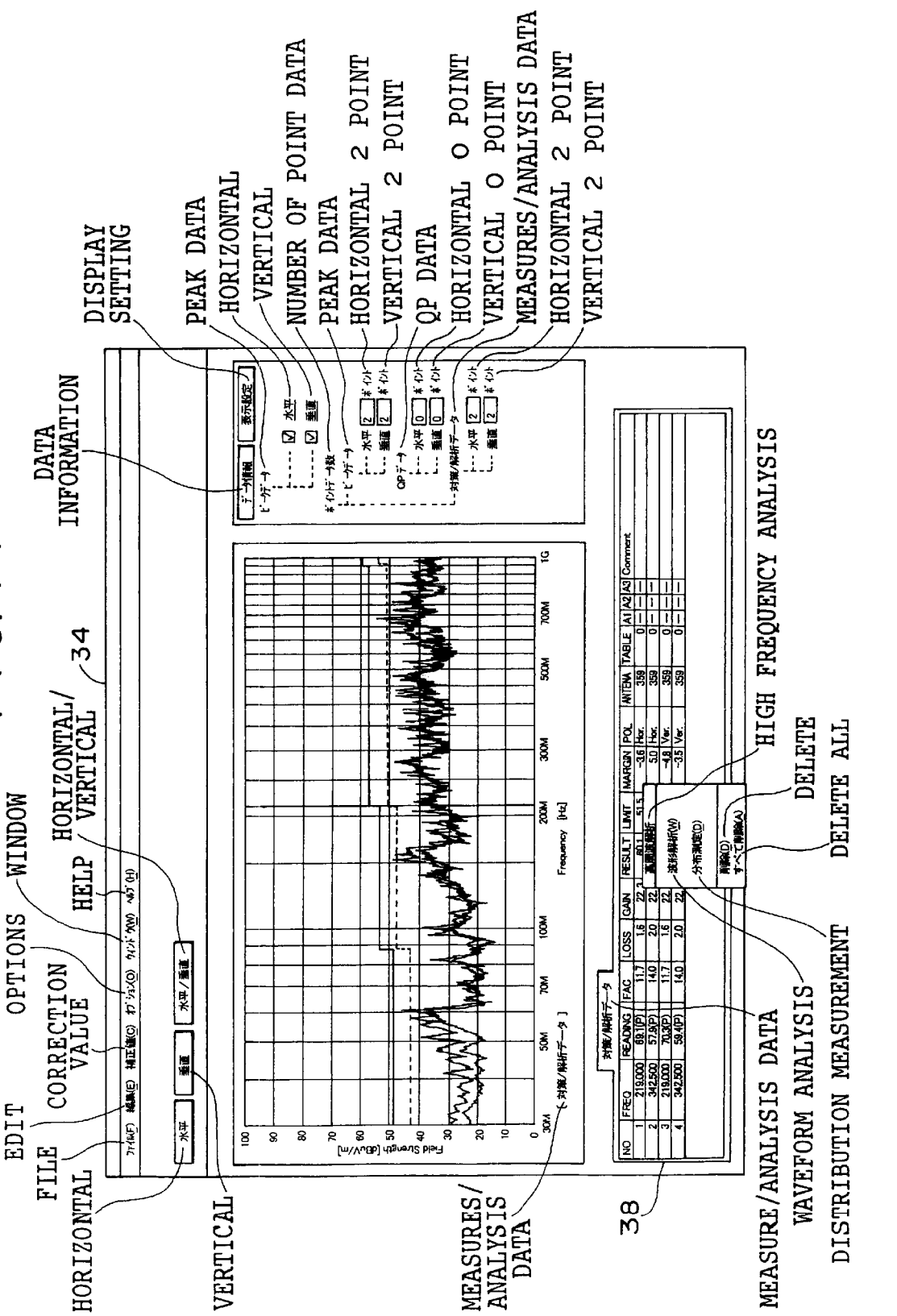
FIG. 14 is a example view of a picture plane displayed in the electromagnetic measurement in the third embodiment.

Next, the operator selects a point (frequency) to be analyzed from the analysis list 38 shown in FIG. 14 (in a step 602). Date on the selected point is fed to a harmonic analysis program (in a step 604) and the harmonic analysis program is started (in a step 606). As a result, a picture shown in FIG. 15 is displayed on the monitor 34.

Then, basic set values are set to the spectrum analyzer 16 (in a step 608) and the center frequency of the spectrum analyzer 16 is set at the frequency selected from the analysis list (in a step 610).

Figure 15:
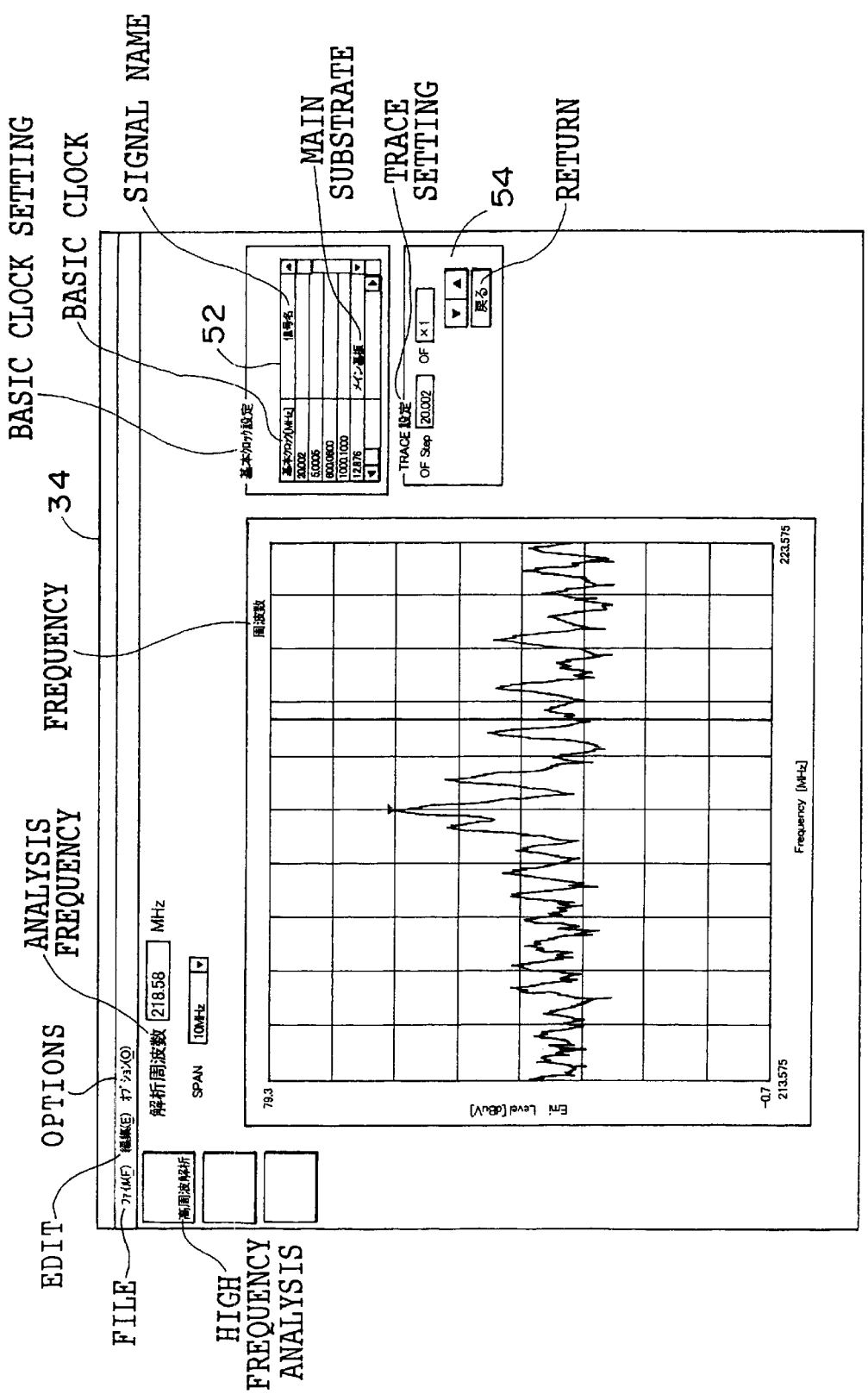
FIG. 15 is an example view of a picture plane displayed in the electromagnetic measurement in the third embodiment.

Next, a file of a basic clock list is loaded and displayed on a window 52 as shown in FIG. 15 (in a step 614). The present waveform of the spectrum analyzer 16 is acquired and displayed on the monitor 34 (in a step 614).

It is then judged whether or not a frequency vertical movement button 54 has been pressed (in a step 616). If pressed, the center frequency is shifted by the basic clock (frequency) selected from the basic clock list (in a step 617).

Figure 16:
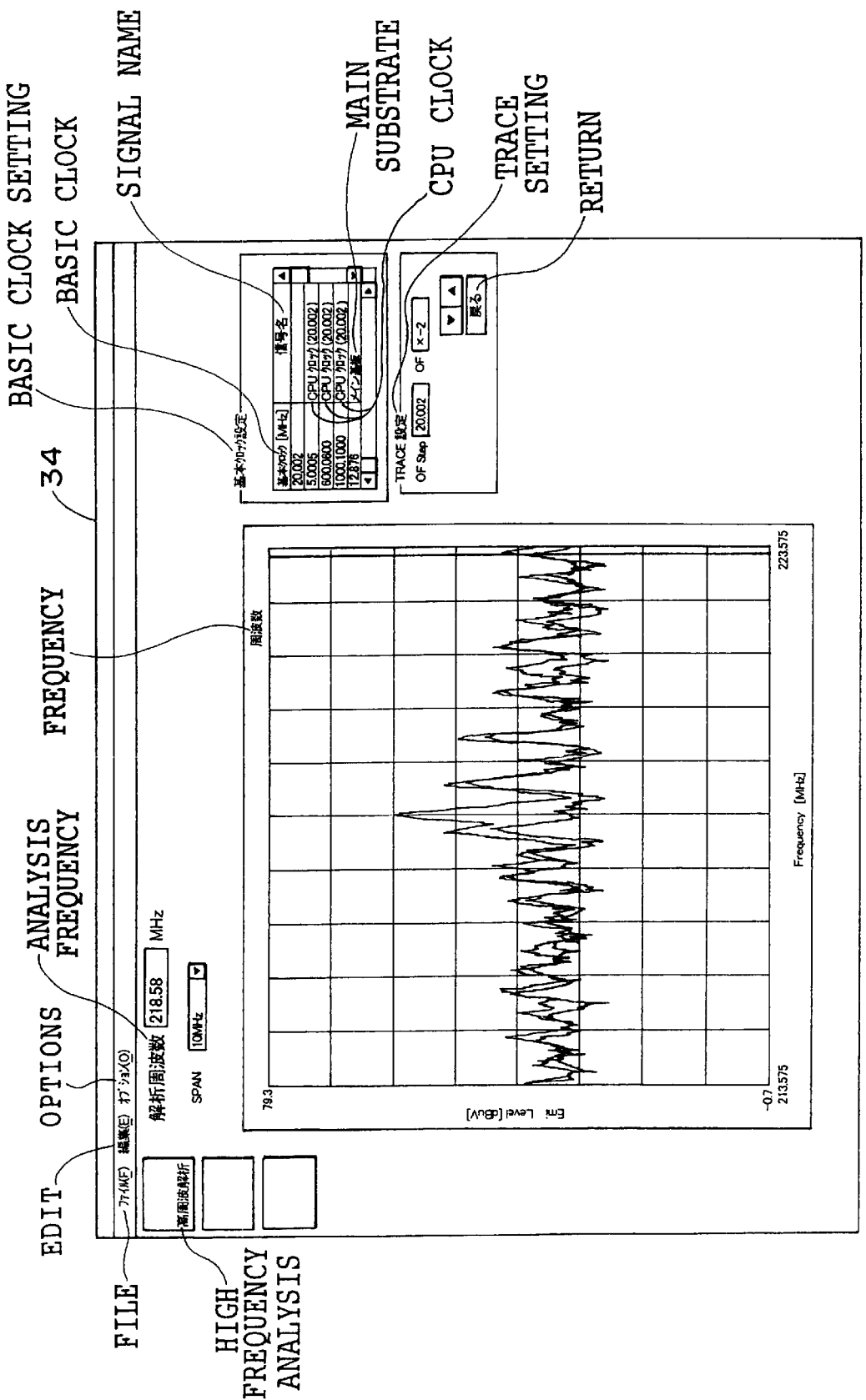

The present waveform of the spectrum analyzer 16 is acquired and superposed on the waveform of the basic frequency, and displayed on the monitor 34 as shown in FIG. 16 (in a step 618). The steps 616 to 618 are repeated depending on the operator's judgment (in a step 620). Since the harmonic components of the basic clock are superposed on the present waveform of the spectrum analyzer 16 and displayed, it is possible to easily specify that the frequency of the electromagnetic noise to need to be prevented corresponds to which harmonic component of the basic clock and to thereby easily specify the noise source.

Figure 13:
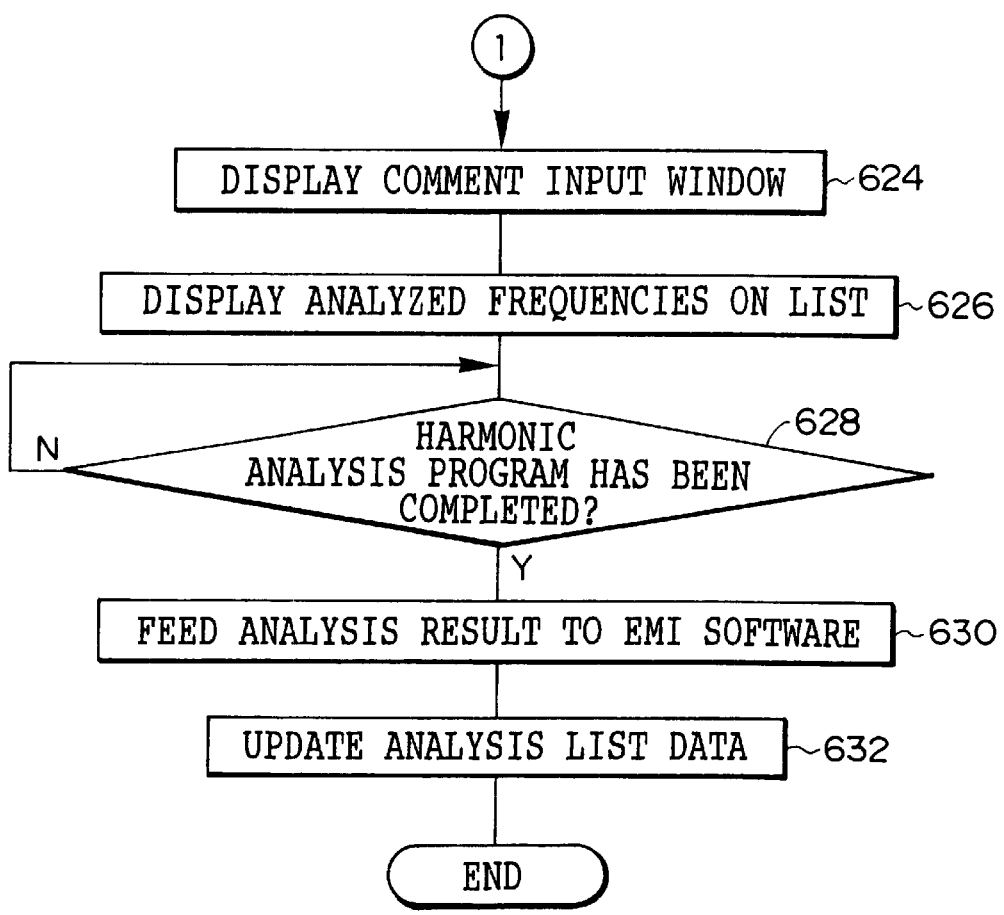
FIG. 13 is an example view of a picture plane displayed in the electromagnetic measurement in the third embodiment.

Next, it is judged whether or not a determination button has been pressed (in a step 622). If pressed, a comment window is displayed (in a step 624 shown in FIG. 13) and a list of analyzed frequencies is displayed (in a step 626).

It is then judged whether or not a command to end the harmonic analysis program has been issued (in a step 628). If issued, an analysis result is fed to the EMI software (in a step 630) and analysis list data is updated (in a step 632).

As can be understood from the above, the harmonic component of the basic clock is superposed on the present waveform of the spectrum analyzer 16 and displayed. Due to this, it is possible to easily specify that the frequency of the electromagnetic noise to be prevented corresponds to which harmonic component of the basic clock and to thereby easily specify the noise source.

Fourth Embodiment

The fourth embodiment according to the present invention will be described. In the fourth embodiment, description will be given to a case of analyzing the waveform of measured electromagnetic noise.

First, as already described in the first embodiment, electromagnetic noise radiated from the copying machine 26 is measured and the result is displayed on the monitor 34 according to the flow chart shown in FIG. 2. Analysis target frequencies are selected from the point list 38 and moved to the analysis list (a different software) (in a step 700 shown in FIG. 17)

Next, the operator selects one point (frequency) to be analyzed from the analysis list as shown in FIG. 14 (in a step 702). Data on the selected point is fed to a waveform analysis program (in a step 704) and the waveform analysis program is started (in a step 706).

Then, basic set values are set to the spectrum analyzer 16 (in a step 708). The present waveform (No. 1) of the spectrum analyzer 16 is acquired and displayed on the monitor 34 (in a step 710).

Figure 18:
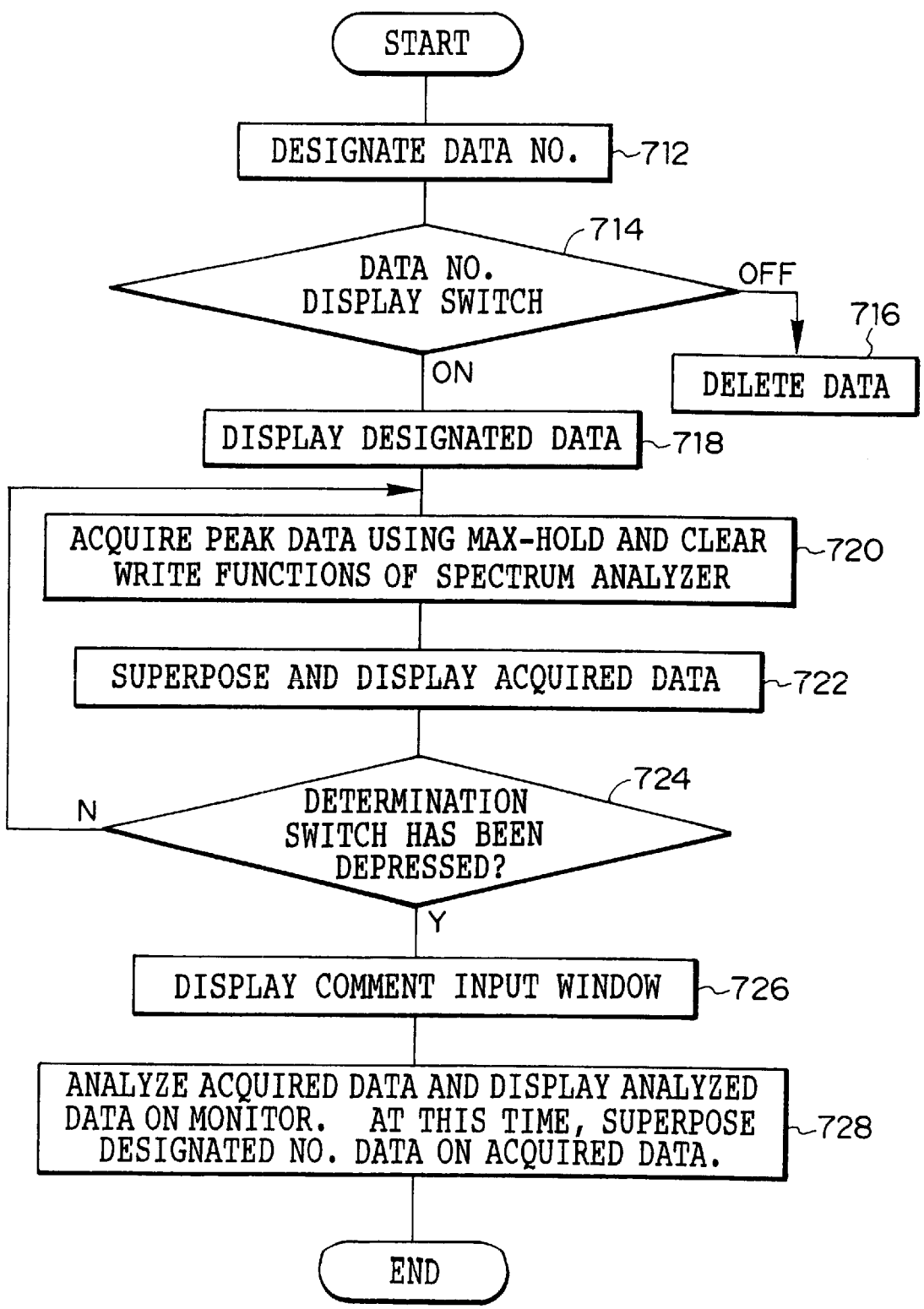
FIG. 18 is a flow chart for measuring electromagnetic waves in the fourth embodiment.

As shown in FIG. 18, a data No. is designated (in a step 712) and it is judged whether or not the display switch of the designated data No. is ON (in step 714). If the switch is OFF, the data is deleted (in a step 716).

On the other hand, if the display switch of the designated data No. is ON, the data of the designated data No. is displayed (in a step 718) and peak data is acquired using the MAX-HOLD function and CLEAR-WRITE function of the spectrum analyzer 16 (in a step 720).

Figure 19:
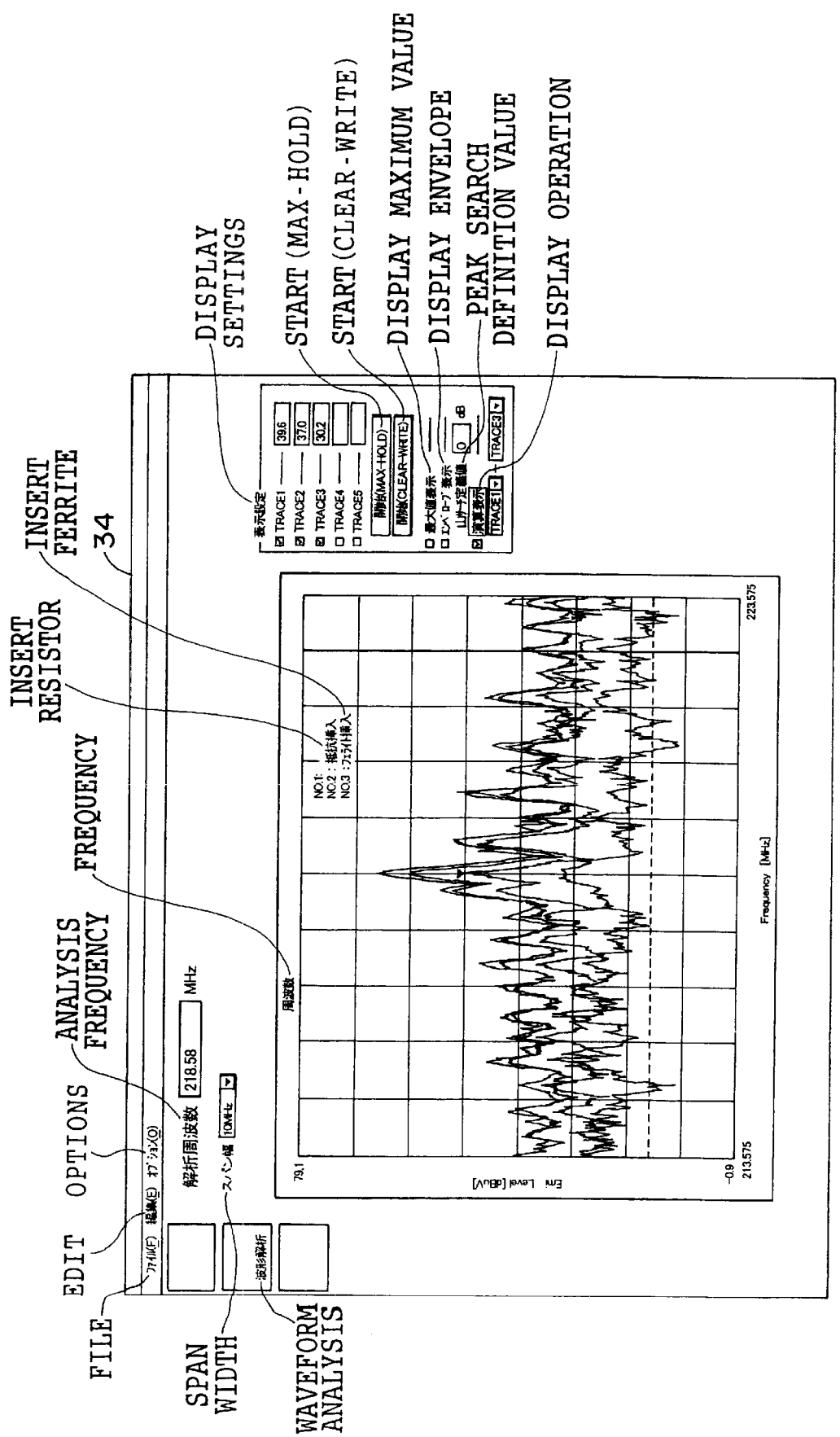
FIG. 19 is an example view of a picture plane displayed in the electromagnetic measurement in the fourth embodiment.

Thereafter, the acquired data are superposed on each other and displayed on the monitor 34 as shown in FIG. 19 (in a step 722). Next, it is judged whether or not the determination switch has been pressed (in a step 724). If pressed, a comment input window is displayed (in a step 726). The acquired data is analyzed and then displayed on the monitor 34. At this moment, the data of the designated data No. is superposed on the resultant data (in a step 728).

As can be understood from the above, it is possible to display a plurality of items of data while superposing them on one another. Accordingly, it is possible to simultaneously display a plurality of items of data which data are measured while various counter-measures have been taken to, for example, the substrate which is considered to be a noise source and to thereby easily compare these plurality of items of data.

Figure 20:
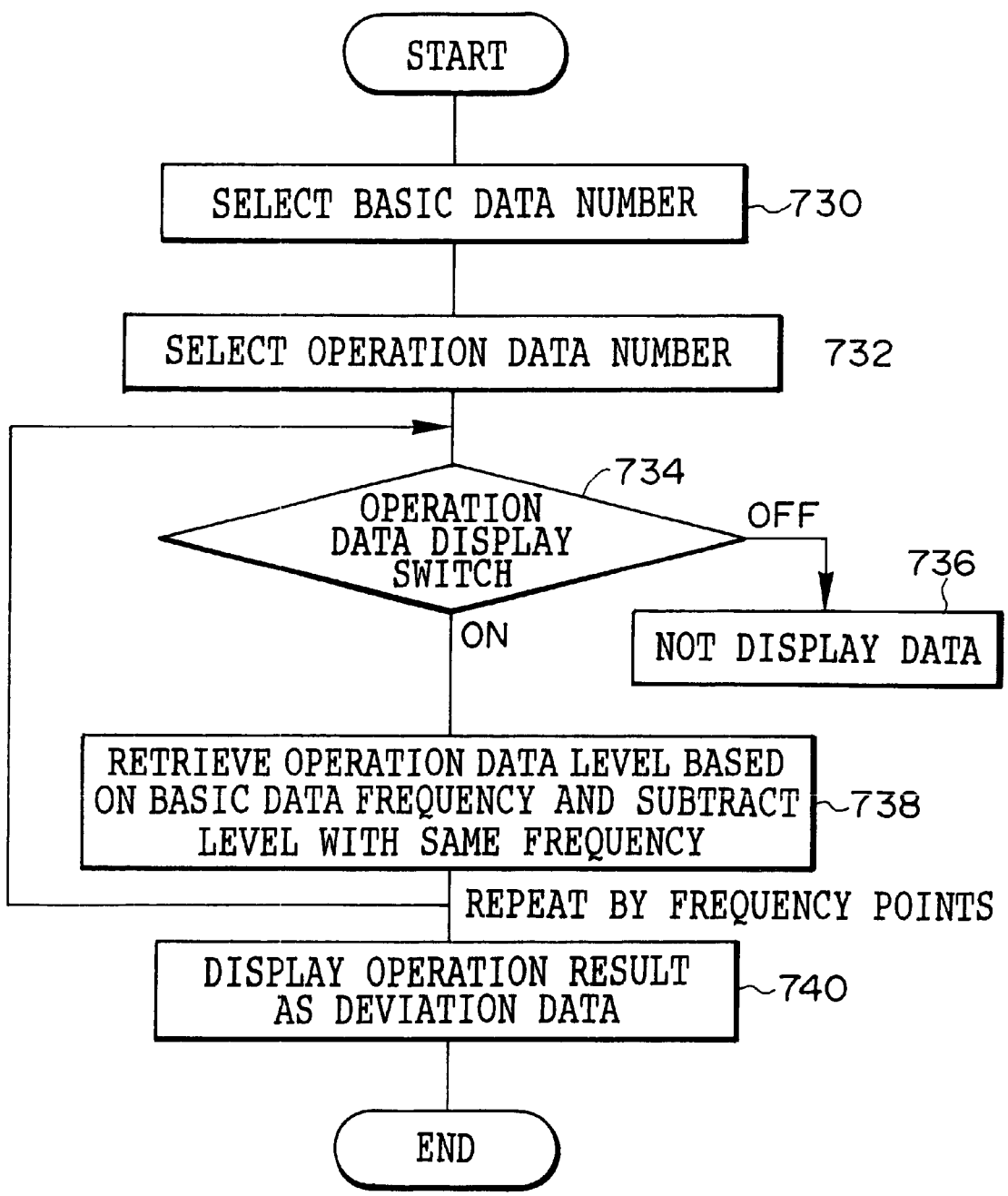
FIG. 20 is a flow chart for measuring electromagnetic waves in the fourth embodiment.

A basic data number is selected from among the plurality of items of data (in a step 730 shown in FIG. 20) and an calculation data number is selected (in a step 732). It is then judged whether or not an calculation data display switch is ON (in a step 734). If the switch is OFF, the data is not displayed (in a step 736). If the switch is ON, the level of the calculation data is retrieved on the basis of the frequency of the basic data and subtracted from the level with the same frequency (in a step 738). The above processings are repeated for all preset frequency points. An calculation result is displayed as deviation data (in a step 740). In this way, the differential data of the respective data can be calculated and displayed. Therefore, if counter-measures have been taken to the substrate which is considered to be the noise source, it is possible to easily grasp effectiveness of the counter measures while comparing the substrate in which such counter-measures have been taken to the substrate in which such counter-measures have not been taken.

Fifth Embodiment

The fifth embodiment according to the present invention will be described. In the fifth embodiment, description will be given to a case of analyzing the waveform distribution of measured electromagnetic noise.

Figure 21:
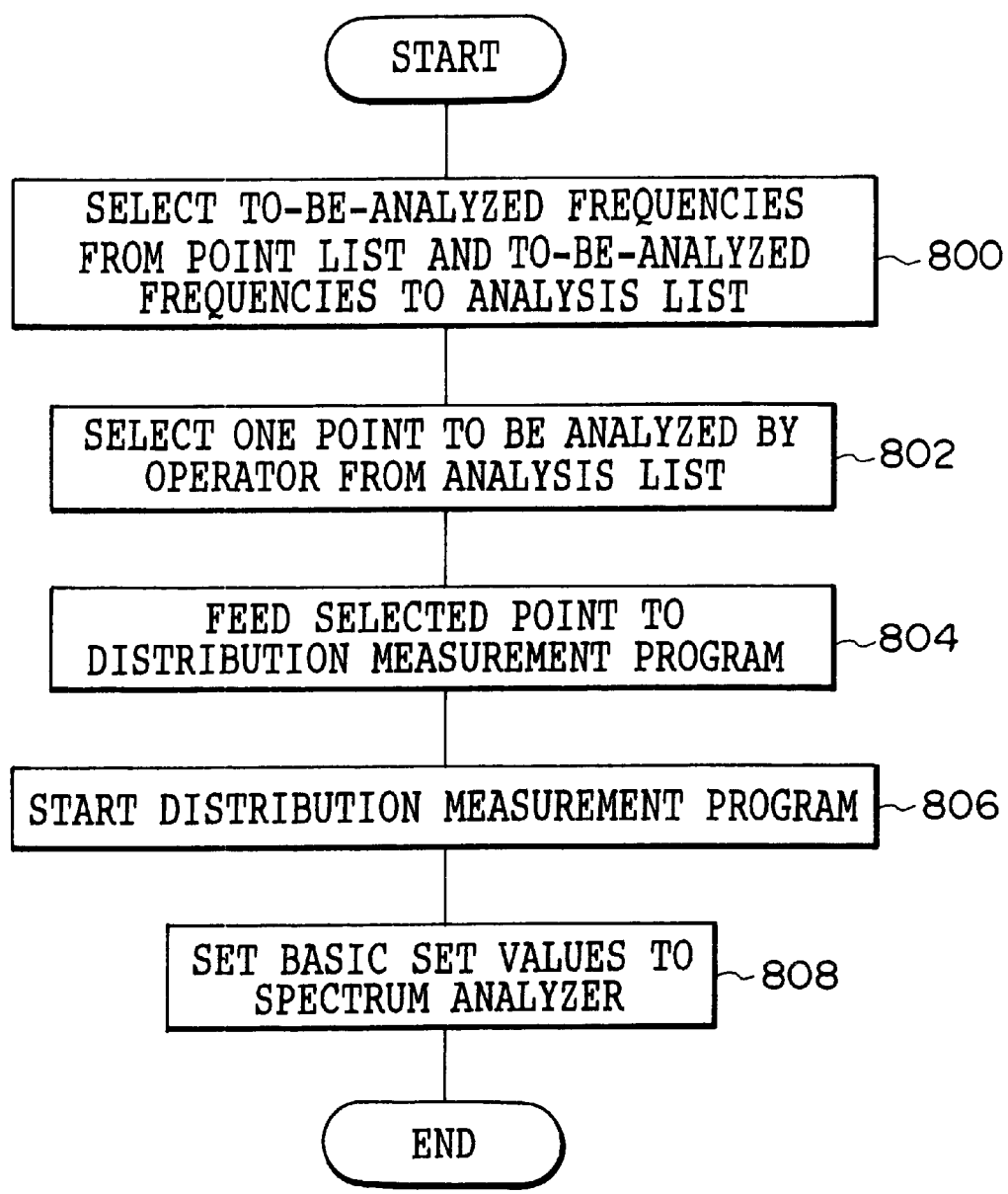
FIG. 21 is a flow chart for measuring electromagnetic waves in the fifth embodiment according to the present invention.

First, as already described in the first embodiment, electromagnetic noise radiated from the copying machine 26 is measured and the result is displayed on the monitor 34 according to the flow chart shown in FIG. 2. Then, analysis target frequencies are selected from the point list 38 and moved to the analysis list (a different software) (in a step 800 shown in FIG. 21).

Next, the operator selects one point (frequency) to be analyzed from the analysis list (in a step 802). Data of the selected point is fed to a distribution measurement program (in a step 804) and the distribution measurement program is started (in a step 806).

Next, basic set values are set to the spectrum analyzer 16 (in a step 806).

Figure 22:
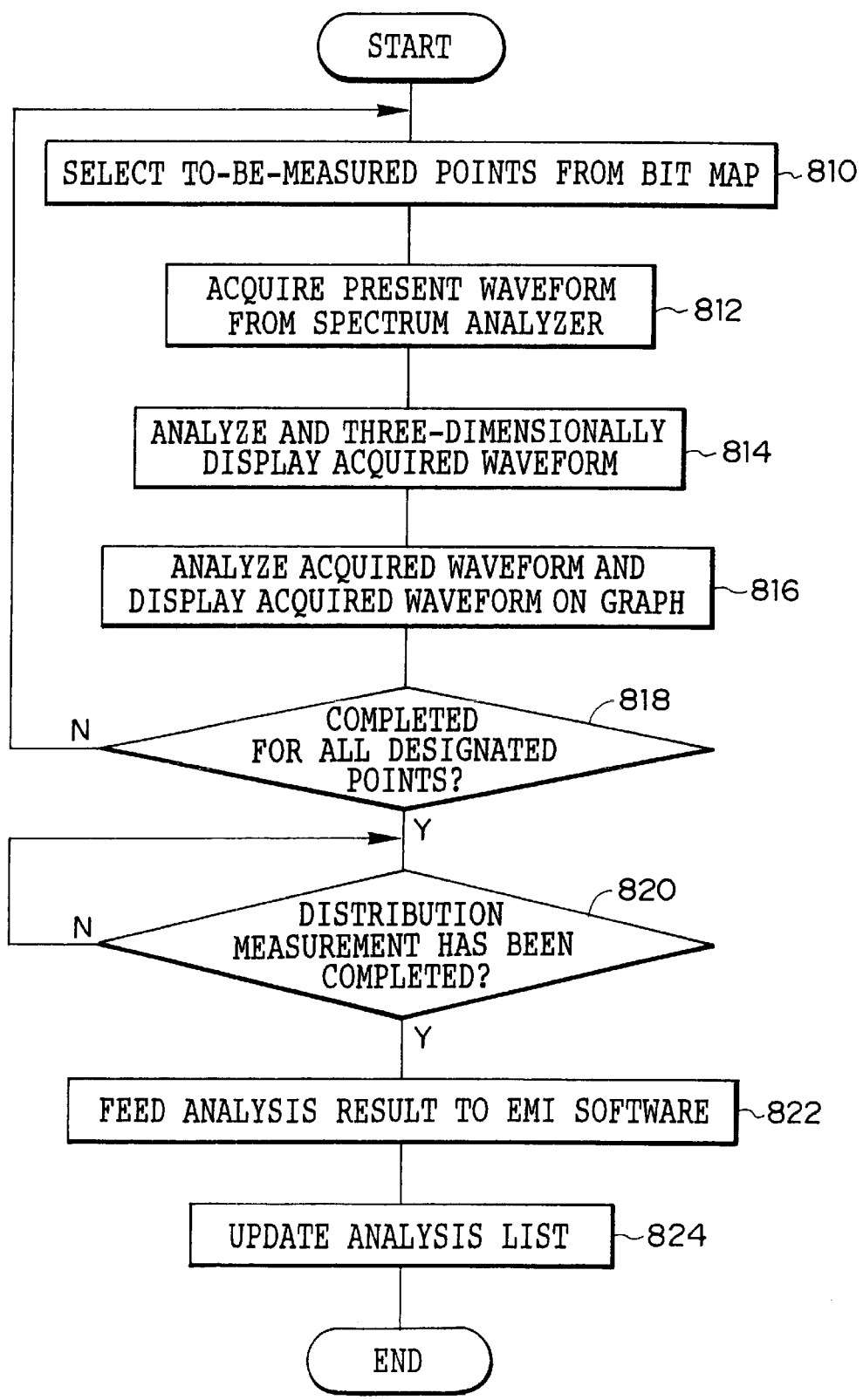
FIG. 22 is a flow chart for measuring electromagnetic waves in the fifth embodiment.
Figure 23:
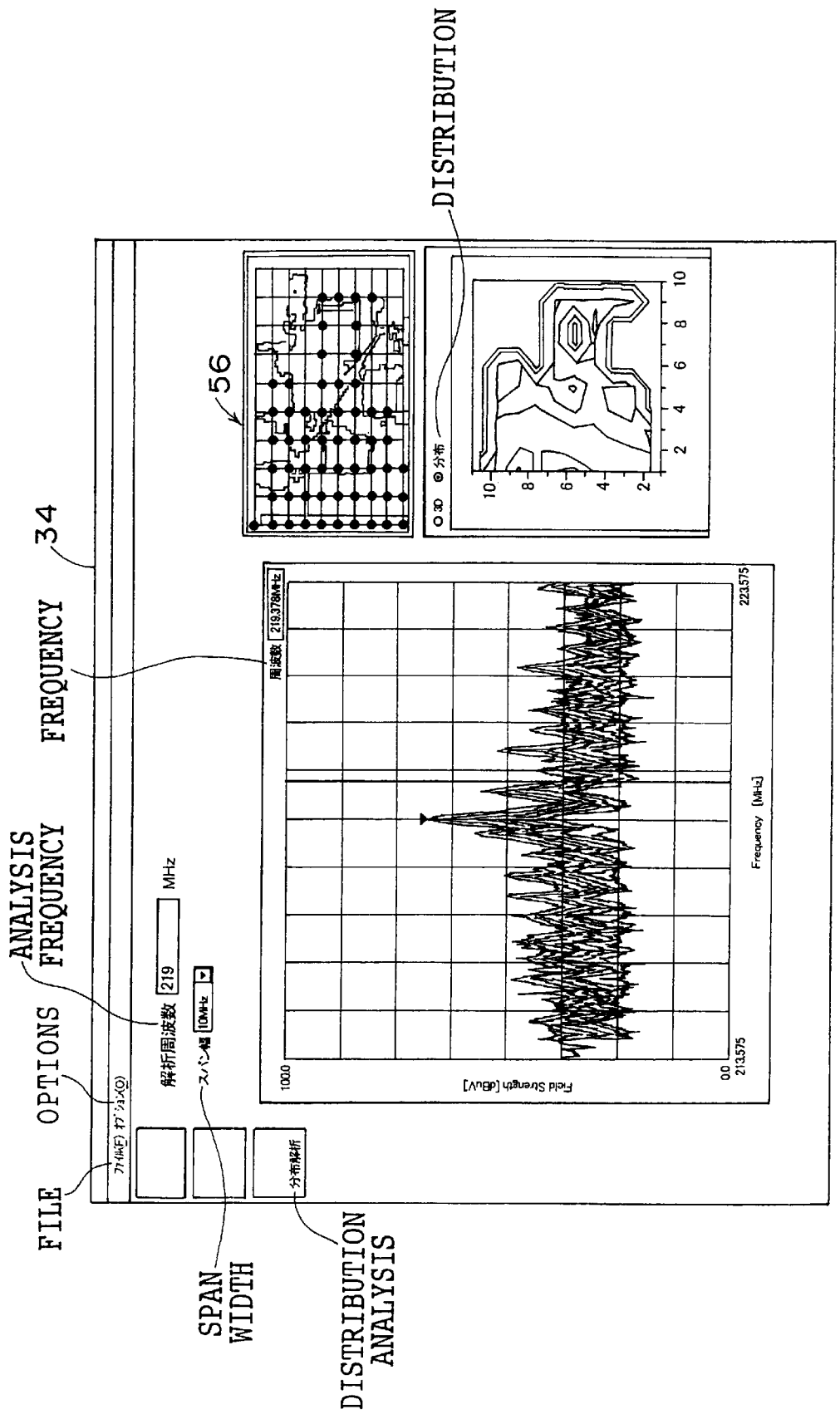
FIG. 23 is an example view of a picture plane displayed in the electromagnetic measurement in the fifth embodiment.
Figure 24:
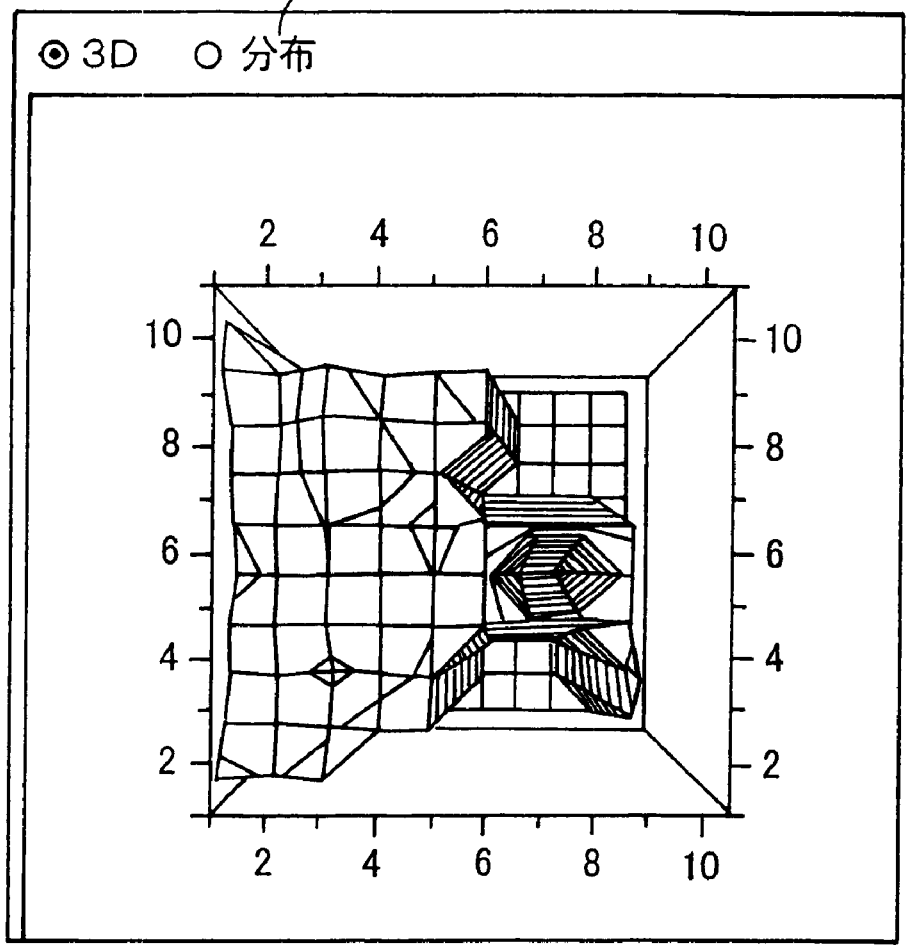
FIG. 24 is an example view of a picture plane displayed in the electromagnetic measurement in the fifth embodiment.

Then, points on the substrate to be measured are selected from a bit map 56 which displays the surface of the substrate as shown in FIG. 23 (in a step 810 shown in FIG. 22) and a present waveform is acquired from the spectrum analyzer 16 (in a step 812). The acquired waveform is analyzed and displayed three-dimensionally as shown in FIG. 24 (in a step 814) and, at the same time, displayed on a graph (in a step 816). In this case, the waveform can be displayed three-dimensionally by giving different colors according to levels such as red to high level parts and blue to low level parts.

Thereafter, it is judged whether or not the measurement has been completed for the designated points (in a step 818). If completed, it is then judged whether or not a command to end distribution measurement has been issued (in a step 820). If the command to end distribution measurement has been issued, an analysis result is fed to the EMI software (in a step 822) and analysis list data is updated (in a step 824).

As can be understood from the above, it is possible to display the distribution of waveforms acquired on the respective points on the substrate three-dimensionally, whereby it is possible to easily judge which part is high in level.

As stated so far, the invention according to the first aspect can advantageously prevent the erroneous measurement of electromagnetic noise and advantageously enhance measurement efficiency.

What is claimed is:

1. An electromagnetic noise measurement apparatus for measuring electromagnetic noise radiated from an equipment to be measured, said apparatus comprising:

an antenna for receiving said electromagnetic noise;

a peak field intensity measuring section which receives said electromagnetic noise from said antenna and measures a peak field intensity of said electromagnetic noise at a specific frequency determined in advance in a predetermined frequency range;

a quasi-peak measuring section which receives said electromagnetic noise from said antenna and measures a quasi-peak of said electromagnetic noise at said specific frequency; and an informing section which receives measurement results from said peak field intensity measuring section and said quasi-peak measuring section, and, if a difference between a peak field intensity value at said specific frequency and a quasi-peak value at said specific frequency is equal to or more than a predetermined value, informs a predetermined message.

2. An electromagnetic noise measurement apparatus according to claim 1, said apparatus further comprising:

a setting section for setting said specific frequency of said quasi-peak measurement section on the basis of said peak field intensity measured by said peak field intensity measurement section and said predetermined frequency range of said peak field intensity measuring section.

3. An electromagnetic noise measurement apparatus according to claim 1, said apparatus further comprising:

a storing device for storing a clock frequency characteristic of at least one clock mounted on the equipment to be measured in advance; and a display device for displaying a wave form of said electromagnetic noise and harmonic component of the clock in a composite manner.

4. An electromagnetic noise measurement apparatus according to claim 1, said apparatus further comprising:

a calculating device for calculating a difference between a wave form of a reference frequency determined in advance and a wave form of said electromagnetic noise at the specific frequency determined in advance.

5. The electromagnetic noise measurement apparatus according to claim 1, wherein a frequency in the predetermined frequency range whose peak field intensity is equal to or more than a predetermined threshold value, is set as the specific frequency.

6. An electromagnetic noise measurement method for measuring electromagnetic noise radiated from an equipment to be measured, said method comprising the steps of:

receiving said electromagnetic noise by an antenna;

measuring a peak field intensity of said electromagnetic noise received by said antenna at a specific frequency determined in advance in a predetermined frequency range;

measuring a quasi-peak of said electromagnetic noise received by said antenna at said specific frequency; and informing a predetermined message if a difference between a peak field intensity value at said specific frequency and a quasi-peak value at said specific frequency is equal to or more than a predetermined value.

7. The electromagnetic noise measurement method according to claim 6, wherein a frequency in the predetermined frequency range whose peak field intensity is equal to or more than a predetermined threshold value, is set as the specific frequency.

8. A computer-readable recording medium which is recorded a program for controlling measurement of electromagnetic noise radiated from an equipment to be measured, wherein said program causes a computer to execute a process including the steps of:

receiving said electromagnetic noise by an antenna;

measuring a peak field intensity of said electromagnetic noise received by said antenna at a specific frequency determined in advance in a predetermined frequency range;

measuring a quasi-peak of said electromagnetic noise received by said antenna at said specific frequency; and informing a predetermined message if a difference between a peak field intensity value at said specific frequency and a quasi-peak value at said specific frequency is equal to or more than a predetermined value.

9. The computer-readable recording medium according to claim 8, wherein a frequency in the predetermined frequency range whose peak field intensity is equal to or more than a predetermined threshold value, is set as the specific frequency.

10. An electromagnetic noise measurement apparatus for measuring electromagnetic noise radiated from an equipment to be measured, said apparatus comprising:

a signal generating section for generating a signal corresponding to said electromagnetic noise;

a plurality of processing sections connected in series, for being inputted said signal from said signal generating section and for performing predetermined processes;

a comparing section for comparing a field intensity level of said signal outputted from said signal generating section with at least one of processed signals which are processed by said plurality of processing sections; and a displaying section for displaying a comparison result of said comparing section.

* * * * *